(12) United States Patent
Shiraishi

(10) Patent No.: US 6,842,221 B1
(45) Date of Patent: Jan. 11, 2005

(54) EXPOSURE APPARATUS AND EXPOSURE METHOD, AND DEVICE MANUFACTURING METHOD

(75) Inventor: Naomasa Shiraishi, Saitama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/926,149

(22) PCT Filed: Feb. 4, 2000

(86) PCT No.: PCT/JP00/00604

§ 371 (c)(1),
(2), (4) Date: Sep. 12, 2001

(87) PCT Pub. No.: WO00/55891

PCT Pub. Date: Sep. 21, 2000

(30) Foreign Application Priority Data

Mar. 12, 1999 (JP) .......................................... 11/066736

(51) Int. Cl.$^7$ ........................ G03B 27/52; G03B 27/42; G03B 27/32
(52) U.S. Cl. .............................. 355/30; 355/53; 355/77
(58) Field of Search .............................. 355/30, 53, 72, 355/75, 77; 356/237.4, 237.5; 430/5, 311, 396; 414/937, 940

(56) References Cited

U.S. PATENT DOCUMENTS

| | | | | |
|---|---|---|---|---|
| 5,422,704 A | * | 6/1995 | Sego ........................... 355/53 |
| 5,492,587 A | * | 2/1996 | Hong ........................ 156/246 |
| 5,559,584 A | | 9/1996 | Miyaji et al. | |
| 5,723,860 A | * | 3/1998 | Hamada et al. ............. 250/239 |
| 5,883,704 A | | 3/1999 | Nishi et al. | |
| 6,153,044 A | * | 11/2000 | Klebanoff et al. ........ 156/345.3 |
| 6,335,787 B1 | * | 1/2002 | Nishi ........................... 355/67 |
| 6,337,161 B2 | * | 1/2002 | Chiba et al. ................... 430/5 |
| 6,356,338 B2 | * | 3/2002 | Arakawa ..................... 355/30 |
| 6,590,631 B2 | * | 7/2003 | Miwa et al. .................. 355/30 |

FOREIGN PATENT DOCUMENTS

| | | |
|---|---|---|
| JP | 9-73167 | 3/1997 |
| JP | 9-246140 | 9/1997 |
| JP | 11-274050 | 10/1999 |
| JP | 2000-19721 * | 1/2000 |

\* cited by examiner

*Primary Examiner*—Alan Mathews
(74) *Attorney, Agent, or Firm*—Oblon, Spivak, McClelland, Maier & Neustadt, P.C.

(57) ABSTRACT

After a mask is carried into a reserve room for temporarily storing before carrying into a mask room filled with specific gas that has an impurity concentration lower than a first concentration (e.g. 1 ppb) and that has a characteristic of absorbing little exposure light, gas-replacement mechanisms replace gas in the reserve room with specific gas having an oxygen concentration not lower than the first concentration. Therefore, when subsequently carrying the mask into the mask room, impurities from the outside (including absorbent gas) can be substantially prevented from getting into the optical path inside the mask room. When replacing a wafer, gas in a reserve room is also replaced in the same way as the above.

41 Claims, 11 Drawing Sheets

EXPOSURE APPARATUS AND EXPOSURE METHOD, AND DEVICE MANUFACTURING METHOD

TECHNICAL FIELD

The present invention relates to an exposure apparatus and exposure method, and a device manufacturing method and more particularly to an exposure apparatus and exposure method used in forming fine patterns on electronic devices such as semiconductor integrated circuits and liquid crystal displays, and a device manufacturing method using the exposure apparatus and exposure method.

BACKGROUND ART

In forming fine patterns on electronic devices such as semiconductor integrated circuits and liquid crystal displays, a method has been used which transfers a pattern, having a size about 4 to 5 times the size of an actual pattern on the wafer, on a photo-mask or a reticle (both to be referred to as a "reticle" hereinafter) onto a substrate subject to exposure such as a wafer, reducing the pattern by using a reduction-projection exposure apparatus such as a stepper.

In projection exposure apparatuses for transferring a pattern, exposure apparatuses of a newer generation use exposure light having a wavelength shorter than that of the previous generation, corresponding to semiconductor integrated circuits becoming finer. Although, at present, KrF excimer laser having a wavelength of 248 nm is mainly used, ArF excimer laser having a shorter wavelength of 193 nm is going to be used. And projection exposure apparatuses that utilize $F_2$ laser having a wavelength of 157 nm or $Ar_2$ laser having a wavelength of 126 nm have been suggested.

Such light in the wavelength band of 120 to 200 nm is vacuum ultraviolet light and has a poor transmittance to optical glass. Usable materials of lenses and reticles for a VUV exposure apparatus, which utilizes vacuum ultraviolet light (VUV) as exposure illumination light, are limited to crystal such as fluorite, magnesium fluoride and lithium fluoride. Moreover, because the energy absorption of exposure light by gas such as oxygen, steam and hydro carbon (referred to as absorbent gas) is extremely large, gas in the optical path of exposure light needs to be replaced with low-absorbent gas, which absorbs little of the exposure light energy, so as to remove absorbent gas from the optical path.

Because the energy absorption of vacuum ultraviolet light by oxygen is extremely large, the average concentration of oxygen in the optical path needs to be restricted to a value smaller than about 1 ppm. Specially, because the total length of the optical path of a so-called illumination optical system from the light source to the reticle is long, the oxygen concentration needs to be restricted to an even smaller value. Meanwhile, because the length of the optical path from the projection optical system to the wafer is short, e.g. several to several tens mm, a small quantity of absorbent gas in this path has no significant impact on the absorption.

However, because an exposure apparatus used in mass-production of integrated circuits such as LSI's needs to expose about 80 wafers per hour to exposure light, there is a large possibility of absorbent gas from the outside getting into the optical path of exposure light from the projection optical system to the wafer upon the frequent replacement of wafers.

In addition, although, also in the optical path near the reticle, the oxygen concentration needs to be kept lower than several ppm, there is a possibility of absorbent gas from the outside getting into the optical path when replacing a reticle in the apparatus.

If absorbent gas gets into the optical paths of exposure light due to those factors, absorption rate and thus transmission fluctuate to some extent depending on the concentration of the absorbent gas, and exposure light energy on the wafer (a substrate subject to exposure) becomes unstable. Furthermore, if there is water or organic pollutants in the optical paths, a small quantity of such pollutants are very likely to stick to the surfaces of optical elements. Because the pollutants greatly absorb vacuum ultraviolet light (exposure light), transmission in the optical systems decreases due to the small quantity of pollutants sticking to the surfaces of the optical elements. Meanwhile, by irradiating the surfaces of the optical elements with vacuum ultraviolet light, organic substances are cut into smaller pieces and removed from the surfaces by the energy of the ultraviolet light, and the transmission of the exposure light increases. Therefore, pollutants in the optical paths cause variation of exposure light transmission.

This invention was made under such circumstances, and a first purpose of this invention is to provide an exposure apparatus and exposure method that can highly accurately transfer a pattern using exposure light in a vacuum ultraviolet band.

Moreover, a second purpose of this invention is to provide an exposure apparatus and exposure method that can suppress decrease and variation of exposure light transmission due to absorbent gas and pollutants in optical paths of exposure light.

A third purpose of this invention is to provide a device manufacturing method that can improve productivity of highly integrated devices.

DISCLOSURE OF INVENTION

According to a first aspect of this invention, there is provided a first exposure apparatus that transfers a pattern of a mask onto a substrate by irradiating said mask with exposure-illumination light, the exposure apparatus comprising: a plurality of sealed rooms in each of which said mask is temporarily stored, including a mask room that covers at least an optical path near said mask of the optical path of said exposure-illumination light from said mask to said substrate; and wherein said sealed rooms are filled with the same kind of specific gas, or different kinds of specific gases, having a characteristic of absorbing little of said exposure illumination light, and wherein the concentration of impurities in said specific gas in at least one of said sealed rooms is different from the concentration of impurities in said specific gas in said mask room.

Hereinafter, the word "impurity" refers to any of absorbent gases such as oxygen, steam and hydro carbon, and organic pollutants, which have the characteristic of absorbing much of the exposure illumination light, as opposed to the specific gas having the characteristic of absorbing little of the exposure illumination light. Moreover, the words "specific gas" and "low absorbent gas" both refer to any inert gas to exposure illumination light.

According to this, a plurality of sealed rooms in each of which a mask for exposure is temporarily stored are filled with the same kind of specific gas, or different kinds of specific gases, having a characteristic of absorbing little of exposure illumination light. Therefore, after and before the mask is carried into the mask room for exposure, the mask is under the gas environment filled with the specific gas.

Accordingly, when a mask is carried into the mask room for exposure, impurities can be substantially prevented from getting into the optical path inside the mask room. In this way, in the optical path inside the mask room, the decrease and variation of transmittance of the exposure light and the decrease of uniformity of illuminance can be suppressed that are caused by the energy absorption of the exposure light, thereby ensuring stable and enough exposure light power.

In this case, because the concentration of impurities in the specific gas in at least one of the sealed rooms is different from the concentration of impurities in the specific gas in the mask room, the impurity-concentration of the specific gas inside at least one of the sealed rooms can be set to be higher than that of the mask room, the time for which a mask stays in a sealed room being shorter than that, usually longest, in the mask room. Therefore, the equipment becomes simple compared with setting the specific gas environment of all the sealed rooms to be equivalent to that of the mask room, and the equipment cost can be reduced.

In the first exposure apparatus according to this invention, said plurality of sealed rooms may include said mask room and a mask-reserve room that is arranged adjacent to said mask room and that temporarily contains said mask before being carried into said mask room.

In this case, there is provided an exposure apparatus wherein the concentration of impurities in said specific gas filling said mask room is lower than a first concentration, and wherein the concentration of impurities in said specific gas filling said mask-reserve room is equal to a second concentration that is about 10 to 100 times said first concentration. It is preferable that when an impurity in the specific gas is, e.g., organic pollutant, the first concentration is about 1 or 10 ppb, that when the impurity is water, it is about ten times the above (about 10 ppb or 100 ppb) and that when the impurity is absorbent gas such as oxygen, it is about three times that of absorbent gas (about 30 ppb or 300 ppb).

In this case, there is provided an exposure apparatus, wherein said mask-reserve room has two gates that include a gate provided on the boundary with said mask room and each of which is opened and closed by a door, said exposure apparatus further comprising: a gas-replacement mechanism that replaces gas in said mask-reserve room with said specific gas having an impurity concentration being about said second concentration before carrying said mask into said mask room. In this case, when for temporally storing, a mask is carried into the mask-reserve room from outside before being carried into the mask room which is filled with specific gas having the concentration of impurities equal to the first concentration, the gas-replacement mechanism replaces gas in the mask-reserve room with specific gas having an impurity concentration being about the second concentration. Accordingly, when subsequently, the mask is carried into the mask room for exposure, impurities can be substantially prevented from getting into the optical path inside the mask room. In this way, in the optical path inside the mask room, the decrease and variation of transmittance of the exposure light and the decrease of uniformity of illuminance can be suppressed that are caused by the energy absorption of the exposure light, thereby ensuring stable and enough exposure light power.

In this case, when said mask is carried into said mask-reserve room, said gas-replacement mechanism may perform said gas replacement by supplying said specific gas to said mask-reserve room after discharging gas in said mask-reserve room to decrease the internal pressure. In this case, because water and so forth adhering to the mask (by adsorption) in the mask-reserve room can be efficiently removed by the above decrease of the internal pressure, it is possible to prevent the water from absorbing exposure light when subsequently performing exposure in the mask room. When water is attached to the surface of a mask, the water is chemically resolved by illuminating with exposure illumination light and removed from the surface. This means that due to the chemical resolution of water, the loss of light amount at the beginning of exposure and thus the exposure amount variation between the beginning and the end of exposure occur and cause degradation of controllability of the exposure amount. However, because absorption of exposure light can be suppressed according to this invention, the exposure amount can be accurately controlled.

In the first exposure apparatus according to this invention, it is preferable that a door of said mask-reserve room that opens and closes said gate provided on the boundary with said mask room is a high-speed shutter. When transferring a mask into the mask room, the door of the gate is opened and closed, and the mask room where impurities in the specific gas are at the first concentration and the mask-reserve room where impurities in the specific gas are at the second concentration are connected. Therefore, the concentration of impurities in the specific gas inside the mask room rises in proportion to the time for which the door is open. Because the door is a high-speed shutter and can be opened and closed at high speed, the increase of the concentration of impurities in the specific gas inside the mask room can be substantially suppressed. This is also the case with transferring a mask from the mask room.

There is provided an exposure apparatus according to the first exposure apparatus, wherein the plurality of sealed rooms include a mask room and a mask-reserve room, wherein in a chamber constituting said mask-reserve room, a delivery port is provided into and from which a sealed-type mask container containing said mask and having a door that can be opened and closed is loaded and unloaded, and wherein in said mask-reserve room, an open-close mechanism is provided which opens and closes the door of said mask container with isolating the inside of said mask-reserve room from the outside. In this case, a sealed-type mask container containing a mask is loaded into the delivery port provided in the mask-reserve room, and the open-close mechanism can open the door while isolating the inside of the mask-reserve room from the outside. Accordingly, when a mask is removed, impurities such as absorbent gases and organic pollutants can be prevented from getting into the mask-reserve room and from adhering to the mask.

In this case, said mask-reserve room may be divided into a plurality of sub-rooms including a first room adjacent to said mask room and a second room where said open-close mechanism is provided, by division walls having a door that can be opened and closed, and the concentrations of impurities in said specific gas in said plurality of sub-rooms may be set such that the concentration of impurities in said specific gas in said first room is not lower than said first concentration and lower than the concentration of impurities in said specific gas in said second room. In this case, the impurity-concentrations of the specific gas inside the plurality of sub-rooms are set such that the impurity-concentrations of the specific gas inside the second room is highest, the second room being furthest away from the mask room for exposure. Accordingly, the concentrations of the specific gas inside the plurality of sub-rooms can be set to desirable concentrations, and the concentration of the specific gas inside the first room that is closest to the mask room is highest, and thus, when a mask is carried into the mask room, impurities can be substantially prevented from getting into the optical path inside the mask room along with the mask.

In the first exposure apparatus according to this invention, said mask container may be a bottom-open-type mask container on the bottom of which said door is provided, the mask container being loaded and unloaded into and from the delivery port provided in the chamber constituting the mask-reserve room. Needless to say, this mask container may be of a FOUP type (Front Opening Unified Pod).

In the first exposure apparatus according to this invention, when the plurality of sub-rooms include a mask room and a mask-reserve room, in a path for carrying said mask, an energy-beam-emitting portion may be provided which irradiates said mask with an energy beam in an ultraviolet range. In this case, by irradiating a mask being transported with an energy beam, in an ultraviolet range, emitted from the energy-beam-emitting portion, impurities adhering to the mask such as moisture and organic pollutants can be removed before exposure. In this case, the removal of moisture by the decrease of pressure in the mask-reserve room is not needed.

It is remarked that the energy-beam-emitting portion may be a beam source of an energy beam such as a lamp, or an emitting outlet of an optical fiber or guiding optical system for guiding ultraviolet light.

In this case, said energy-beam-emitting portion may be provided in said mask-reserve room. In this case, the replacement of gas in the mask-reserve room can be performed by gas flow without causing a problem.

In the first exposure apparatus according to this invention, when the plurality of sub-rooms include a mask room and a mask-reserve room, in said mask-reserve room, a mask-transport system may be arranged which transports said mask from and to said mask room. In this case, no mask-transport system needs to be provided in the mask room, thereby being able to reduce the size of the mask room. That is, because the mask room of which the impurity-concentration of the specific gas has to be lowest can be reduced in size, the equipment for setting the specific gas environment of the mask room becomes simpler, and the cost of the equipment can be reduced.

There is provided an exposure apparatus according to the first exposure apparatus, further comprising: a projection optical system that projects said exposure-illumination light emitted from said mask onto said substrate, and wherein said mask room covers the optical path between said mask and said projection optical system. Because usually the projection optical system is composed of a barrel and optical elements held therein, impurities can be substantially prevented from getting into the exposure light optical path from the mask to the end, close to the image field, of the projection optical system by filling the inner space of the barrel with the specific gas.

The first exposure apparatus according to this invention may further comprise: a mask-store portion that stores said mask; and a mask-transport system that transports said mask between said mask-store portion and said mask room. In this case, because the mask-store portion stores a mask, and a mask-transport system transports the mask between the mask-store portion and the mask room, the transport time can be shortened as compared with the case of transporting the mask from outside.

In this case, said mask-store portion may be a mask library that stores a plurality of masks that are of the same type as said mask. In this case, because the mask library stores a plurality of masks, and the mask-transport system transports the masks between the mask library and the mask room, the transport time can be considerably shortened as compared with the case of transporting the masks one by one from outside.

In this case, there is provided an exposure apparatus, wherein said mask library stores said mask contained in a mask case, further comprising: a gas-supply mechanism that can supply said specific gas into said mask case stored. In this case, the gas-supply mechanism can supply the specific gas into the mask case stored in the mask library and place the masks under the specific gas environment.

In this case, the mask-transport system may transport a mask taken out of a mask case in the mask library. Alternatively, when said mask case is a sealed-type mask case that stores at least a mask and that has a door that can be opened and closed, said mask-transport system may transport said mask contained in a mask case to any one of said sealed rooms except for said mask room, and in said sealed room a door-open-close mechanism may be provided which opens and closes the door of said mask case. In this case, impurities can be prevented from getting into the mask case being transported from the mask library to the inside of the sealed room in which the door-open-close mechanism is provided, and the mask in the mask case as one piece can be transported while isolating the mask in the mask case from a pollution source including absorbent gas, which does harm to exposure.

In the first exposure apparatus according to this invention, said mask-store portion may be a sealed-type mask container that is arranged inside or outside any one of said sealed rooms except for said mask room, that stores at least a mask and that has a door that can be opened and closed, and in said sealed room, an open-close mechanism may be provided which opens and closes the door of said mask container with isolating the inside of said sealed room from the outside. In this case, the open-close mechanism can open the door of the sealed-type mask container while isolating the inside of the sealed room from the outside. Accordingly, when the mask is removed, impurities such as absorbent gases and organic pollutants can be prevented from getting into the mask-reserve room, and from adhering to the mask.

The first exposure apparatus according to this invention may further comprise: a substrate room constituted by a sealed room that covers at least an optical path near a substrate of the optical path of said exposure-illumination light from said mask to said substrate and that is filled with said specific gas. Because the substrate room is also filled with the specific gas, impurities can be substantially prevented from getting into the optical path inside the substrate room. In this way, in the optical paths inside the mask room and inside the substrate room, the decrease and variation of transmittance of the exposure light can be suppressed that are caused by the energy absorption of the exposure light, thereby ensuring stable and enough exposure light power.

In this case, the first exposure apparatus may further comprise: a substrate-reserve room constituted by a sealed room that is arranged adjacent to said substrate room and that temporarily stores said substrate before being carried into said substrate room; and a gas-replacement mechanism that replaces gas in said substrate-reserve room with said specific gas. In this case, when for temporally storing, a substrate is carried into the substrate-reserve room from outside before being carried into the substrate room, the gas-replacement mechanism replaces gas in the substrate-reserve room with specific gas. Accordingly, when subsequently, the substrate is carried into the substrate room for exposure, impurities can be substantially prevented from getting into the optical path inside the substrate room. In this way, in the optical path inside the substrate room, the decrease and variation of transmittance of the exposure light can be suppressed that are caused by the energy absorption of the exposure light, even with frequent substrate replacement.

There is provided an exposure apparatus according to the first exposure apparatus, wherein a substrate room is provided, further comprising: a projection optical system that projects said exposure-illumination light emitted from said mask onto said substrate, and wherein said substrate room covers the optical path between said substrate and said projection optical system. Because usually the projection optical system is composed of a barrel and optical elements held therein, impurities can be prevented from getting into the exposure light optical path from the end, close to the object surface, of the projection optical system to the substrate by filling the inner space of the barrel with the specific gas.

According to a second aspect of this invention, there is provided a second exposure apparatus that transfers a pattern of a mask onto a substrate by irradiating said mask with exposure-illumination light, the exposure apparatus comprising: a plurality of sealed rooms in each of which said substrate is temporarily stored, including a substrate room that covers at least an optical path near said substrate of the optical path of said exposure-illumination light from said mask to said substrate; and wherein said sealed rooms are filled with the same kind of specific gas, or different kinds of specific gases, having a characteristic of absorbing little of said exposure illumination light, and wherein the concentration of impurities in said specific gas in at least one of said sealed rooms is different from the concentration of impurities in said specific gas in said substrate room.

According to this, a plurality of sealed rooms in each of which a substrate for exposure is temporarily stored are filled with the same kind of specific gas, or different kinds of specific gases, having a characteristic of absorbing little of exposure illumination light. Therefore, after and before the substrate is carried into the substrate room for exposure, the substrate is under the gas environment filled with the specific gas. Accordingly, when a substrate is carried into the substrate room for exposure, impurities can be substantially prevented from getting into the optical path inside the substrate room. In this way, in the optical path inside the substrate room, the decrease and variation of transmittance of the exposure light and the decrease of uniformity of illuminance can be suppressed that are caused by the energy absorption of the exposure light, thereby ensuring stable and enough exposure light power. In this case, because the concentration of impurities in the specific gas in at least one of the sealed rooms is different from the concentration of impurities in the specific gas in the substrate room, the impurity-concentration of the specific gas inside at least one of the sealed rooms can be set to be higher than that of the substrate room, the time for which a substrate stays in a sealed room being shorter than that, usually longest, in the substrate room. Therefore, the equipment becomes simple compared with setting the specific gas environment of all the sealed rooms to be equivalent to that of the substrate room, and the equipment cost can be reduced.

In the second exposure apparatus according to this invention, said plurality of sealed rooms may include said substrate room and a substrate-reserve room that is arranged adjacent to said substrate room and that temporarily contains said substrate before being carried into said substrate room.

In this case, there is provided an exposure apparatus according to the second exposure apparatus, wherein said substrate-reserve room has two gates that include a gate provided on the boundary with said substrate room and each of which is opened and closed by a door, further comprising: a gas-replacement mechanism that replaces gas in said substrate-reserve room with said specific gas having an impurity concentration being a predetermined concentration before carrying said substrate into said substrate room. In this case, when for temporally storing, a substrate is carried into the substrate-reserve room from outside before being carried into the substrate room, the gas-replacement mechanism replaces gas in the substrate-reserve room with the specific gas. Accordingly, when subsequently, the substrate is carried into the substrate room for exposure, impurities can be substantially prevented from getting into the optical path inside the substrate room. In this way, in the optical path inside the substrate room, the decrease and variation of transmittance of the exposure light and the decrease of uniformity of illuminance can be suppressed that are caused by the energy absorption of the exposure light.

In this case, it is preferable that a door that opens and closes said gate provided on the boundary with said substrate room is a high-speed shutter. When transferring a substrate into the substrate room, the door of the gate is opened and closed, and the substrate room and the substrate-reserve room between which the concentrations of impurities in the specific gas are different are connected. Usually the concentration of impurities in the specific gas is set to be lower in the substrate room than in the substrate-reserve room. Therefore, the concentration of impurities in the specific gas inside the substrate room rises in proportion to the time for which the door is open. Because the door is a high-speed shutter and can be opened and closed at high speed, the increase of the concentration of impurities in the specific gas inside the substrate room can be substantially suppressed. This is also the case with transferring a substrate from the substrate room.

In the second exposure apparatus according to this invention, when said substrate is carried into said substrate-reserve room, said gas-replacement mechanism may perform said gas replacement by supplying said specific gas to said substrate-reserve room after discharging gas in said substrate-reserve room to decrease the internal pressure. In this case, because water and so forth adhering to the substrate (by adsorption) in the substrate-reserve room can be efficiently removed by the above decrease of the internal pressure, it is possible to prevent the water from absorbing exposure light when subsequently performing exposure in the substrate room. When water is attached to the surface of a substrate, the water is chemically resolved by illuminating with exposure illumination light and removed from the surface. This means that due to the chemical resolution of water, the loss of light amount at the beginning of exposure and thus the exposure amount variation between the beginning and the end of exposure occur and cause degradation of controllability of the exposure amount. However, because absorption of exposure light can be suppressed according to this invention, the exposure amount can be accurately controlled.

In the second exposure apparatus according to this invention, in said substrate-reserve room, a substrate-transport system may be arranged which transports said substrate from and to said substrate room. In this case, no substrate-transport system needs to be provided in the substrate room, thereby being able to reduce the size of the substrate room. That is, because the substrate room of which the impurity-concentration of the specific gas has to be lowest can be reduced in size, the equipment for setting the specific gas environment of the substrate room becomes simpler, and the cost of the equipment can be reduced.

The second exposure apparatus according to this invention may further comprise: a substrate stage that moves with holding said substrate; and an interferometer that projects a measurement beam through a light-transmission window onto a reflection surface provided on said substrate stage and detects the position of said substrate stage by receiving the reflected light. In this case, by providing a light-transmission window in the substrate room housing the substrate stage, the main body of an interferometer can be arranged outside the substrate room, and a trace of absorbent gas emitted from a detector and so forth composing the interferometer can be prevented from getting into the optical path of exposure light and doing harm to exposure.

The second exposure apparatus according to this invention may further comprise: a substrate stage that moves parallel to a guide plane with holding said substrate; and an gas-static-pressure bearing unit that is provided on said substrate stage and levitates said substrate stage with respect to said guide plane in non-contact and in a supported manner by static pressure of said specific gas in a gap between said guide plane and said bearing unit, said static pressure being generated by blowing said specific gas against said guide plane. In this case, the gas-static-pressure bearing unit levitates the substrate stage without absorbent gas entering the substrate room housing the substrate stage and affecting exposure, and by a planar motor (or linear motor) driving the wafer stage in non-contact, and in two dimensions and at high speed, it is possible to accurately control the position thereof without being affected by the mechanical accuracy of the guide surface.

According to a third aspect of this invention, there is provided a third exposure apparatus that transfers a pattern of a mask onto a substrate by irradiating said mask with exposure-illumination light, the exposure apparatus comprising: a sealed room that stores said mask so as to expose said substrate to said exposure-illumination light and that is filled with specific gas having a characteristic of absorbing little of said exposure illumination light; and a gas-charging mechanism that charges a sealed-type mask case containing said mask with said specific gas again after the completion of exposure using said mask in said sealed room.

According to this, after exposure through a mask in the sealed room, the mask is stored in a mask case, and then the gas-charging mechanism fills the mask case with the specific gas. Therefore, if before the start of exposure, the mask case is filled with the specific gas, the mask case is charged with the specific gas again after the completion of exposure. That is, after and before exposure the mask is placed under the gas environment filled with the specific gas. Thus, water can also be prevented from sticking to the surface of the reticle in stock. Therefore, when removing a mask from the mask case, carrying it into the mask room, and performing exposure thereto and when, after performing exposure and returning the mask into the mask case, taking out the mask to perform exposure through it again, impurities getting into the sealed room along with the mask can be suppressed. In this way, in the optical path inside the sealed room, the decrease and variation of transmittance of the exposure light can be suppressed that are caused by the energy absorption of the exposure light.

In the first and second exposure apparatuses according to this invention, said gas-replacement mechanism may perform said gas replacement by making said specific gas flow continuously, which is especially suitable for masks with no pellicle thereon.

In the first and second exposure apparatuses according to this invention, if the specific gas is supplied after the decrease of pressure, said gas-replacement mechanism may spend time not less than 10 seconds in performing said gas replacement. In the case of a mask with a pellicle thereon, it is possible to prevent the pellicle from breaking. That is, usually a transparent, thin film for protecting the mask pattern against dust adhering thereto, referred to as "pellicle", is usually attached to the pattern side of the mask. If the pressure of the mask-reserve room where a mask with a pellicle is placed drops rapidly, there is a possibility of the pellicle breaking due to the expansion of gas in the space between the pellicle and the mask. Generally, a pellicle-stand for covering a mask with a pellicle has "gas vents" to prevent the pressure variation due to a typhoon approaching and the like from damaging the pellicle. Therefore, when spending enough time in performing pressure decrease and gas replacement, the pellicle is not damaged because the gas goes into and comes out of the space between the pellicle and the mask through the gas vents, thus eliminating the pressure difference between inside and outside during pressure decrease and gas replacement. Also with a mask with no pellicle, moisture contained in the gas can be prevented from freezing due to adiabatic expansion cooling caused by the rapid pressure decrease. Also in the case of wafers, moisture can be prevented from freezing due to adiabatic expansion cooling caused by the rapid pressure decrease.

In the first, second and third exposure apparatuses according to this invention, it is preferable that part of at least one of said sealed rooms, which part contacts said specific gas, is coated with material emitting little gas. In this case, because impurities such as absorbent gas can be prevented from mixing with the specific gas, the decrease and variation of transmittance of the exposure illumination light can be suppressed during exposure.

In the first, second and third exposure apparatuses according to this invention, said specific gas may be supplied and used in a circulated manner in at least one of said sealed rooms. In this case, because the specific gas is supplied and used in a circulated manner, the cost can be reduced compared with the case of not circulating.

In this case, it is preferable that said sealed room where specific gas is used in a circulated manner is connected with a supply system and exhaust system for said specific gas and that a chemical filter that removes said impurities is arranged in both said supply system and exhaust system. Although gas discharged from the sealed room where the specific gas is used in a circulated manner contains a small amount of impurity, by providing chemical filters for removing impurities including absorbent gas such as oxygen in both the supply system and exhaust system, the specific gas can be used in a circulated manner for a long time. In chemical filters, iron or nickel powder may be used. Furthermore, in the case of using, e.g., vacuum ultraviolet light as exposure illumination light, because ammonia absorbs much of exposure light in this wavelength region, it is better to use the filter that also adsorbs ammonia. In this case, filters for removing particles such as HEPA filter (high efficiency particulate air filter) and ULPA filter (ultra low penetration air filter) may be used in combination.

In the first, second and third exposure apparatuses according to this invention, said exposure-illumination light may be light having a wavelength not longer than 200 nm.

Because light in such wavelength region is greatly absorbed by impurities including absorbent gas such as oxygen, the suppression of absorption is especially effective. Thus, it is possible to transfer a fine pattern, using vacuum ultraviolet light as exposure illumination light.

In this case, it is preferable that said specific gas is substantially composed of any number of gases out of nitrogen, argon, helium, neon and krypton. That is, it is preferable that the specific gas is any of nitrogen ($N_2$), argon (Ar), helium (He), neon (Ne) and krypton (Kr), or mixture of any number of them.

According to a fourth aspect of this invention, there is provided a first exposure method that transfers a pattern of a mask (R) onto a substrate (W) by irradiating said mask with exposure-illumination light (EL), the exposure method comprising: a first step of filling a sealed space that covers at least an optical path near said mask of the optical path of said exposure-illumination light from said mask to said substrate with low-absorbent gas that has an impurity concentration lower than a first concentration and that has a characteristic of absorbing little of said exposure illumination light; a second step of temporarily storing said mask in a reserve room adjacent to said sealed space before carrying said mask into said sealed space and replacing gas in said reserve room with said low-absorbent gas that has an impurity concentration not lower than a first concentration and lower than a second concentration; and a third step of transporting said mask to a predetermined position in said sealed space and transferring said pattern onto said substrate.

According to this, the first step fills a sealed space that covers at least an optical path near the mask of the optical path of the exposure-illumination light from the mask to the substrate with low-absorbent gas that has an impurity concentration lower than a first concentration and that has a characteristic of absorbing little of the exposure illumination light; the second step temporarily stores the mask in a reserve room adjacent to the sealed space before carrying the mask into the sealed space and replaces gas in the reserve room with the low-absorbent gas that has an impurity concentration not lower than a first concentration and lower than a second concentration, and the third step transports the mask to a predetermined position in the sealed space and transfers the pattern onto the substrate. Accordingly, when a mask is carried into the sealed room for exposure, impurities can be substantially prevented from getting into the optical path inside the sealed room, the impurities being pollutants, including absorbent gas such as oxygen, which have a characteristic of absorbing much of the exposure illumination light. In this way, in the optical path inside the sealed room, the decrease and variation of transmittance of the exposure light can be suppressed which are caused by the energy absorption of the exposure light upon exposure after transporting the mask, thereby ensuring stable and enough exposure light power.

According to a fifth aspect of this invention, there is provided a second exposure method that transfers a pattern of a mask onto a substrate by irradiating said mask with exposure-illumination light, the exposure method comprising: a first step of filling a sealed space that covers at least an optical path near said substrate of the optical path of said exposure-illumination light from said mask to said substrate with low-absorbent gas that has an impurity concentration lower than a first concentration and that has a characteristic of absorbing little of said exposure illumination light; a second step of temporarily storing said substrate in a reserve room adjacent to said sealed space before carrying said substrate into said sealed space and replacing gas in said reserve room with said low-absorbent gas that has an impurity concentration not lower than a first concentration and lower than a second concentration; and a third step of transporting said substrate to a predetermined position in said sealed space and transferring said pattern onto said substrate.

According to this, the first step fills a sealed space that covers at least an optical path near the substrate of the optical path of the exposure-illumination light from the mask to the substrate with low-absorbent gas that has an impurity concentration lower than a first concentration and that has a characteristic of absorbing little of the exposure illumination light; the second step temporarily stores the substrate in a reserve room adjacent to the sealed space before carrying the substrate into the sealed space and replaces gas in the reserve room with the low-absorbent gas that has an impurity concentration not lower than a first concentration and lower than a second concentration, and the third step transports the substrate to a predetermined position in the sealed space and transfers the pattern onto the substrate. Accordingly, when a mask is carried into the sealed room for exposure, impurities can be substantially prevented from getting into the optical path inside the sealed room. In this way, in the optical path inside the sealed room, the decrease and variation of transmittance of the exposure light can be suppressed which are caused by the energy absorption of the exposure light, thereby ensuring stable and enough exposure light power.

In the first and second exposure methods according to this invention, it is preferable that when an impurity in the specific gas is, e.g., organic pollutant, the first concentration is about 1 or 10 ppb, that when the impurity is water, it is about ten times the above (about 10 ppb or 100 ppb) and that when the impurity is absorbent gas such as oxygen, it is about three times that of absorbent gas (about 30 ppb or 300 ppb).

In the first and second exposure methods according to this invention, the gas replacement in the reserve room may be performed by flow of low-absorbent gas, or in the gas replacement of said second step, said low-absorbent gas may be supplied to said reserve room after discharging gas in said reserve room to decrease the internal pressure. In this case, because water and so forth adhering to the mask or substrate (by adsorption) in the reserve room can be efficiently removed by the above decrease of the internal pressure, it is possible to prevent the water from absorbing exposure light when subsequently carrying the mask or substrate into the sealed room and performing exposure and thus to accurately control the exposure amount.

In the first and second exposure methods according to this invention, said exposure-illumination light may be light having a wavelength not longer than 200 nm. Because light in such wavelength region is greatly absorbed by impurities including absorbent gas such as oxygen, the suppression of absorption is especially effective. Thus, it is possible to transfer a fine pattern, using vacuum ultraviolet light as exposure illumination light.

In this case, it is desirable that said low-absorbent gas be substantially composed of any number of gases out of nitrogen, argon, helium, neon and krypton, that is, any of nitrogen ($N_2$), argon (Ar), helium (He), neon (Ne) and krypton (Kr), or mixture of any number of them.

In addition, because by performing exposure using an exposure apparatus according to this invention in a lithography process, exposure is performed with stable exposure intensity, patterns can be accurately formed on a substrate.

Therefore, it is possible to manufacture highly-integrated micro devices with high yield and improved productivity. Furthermore, because by using an exposure method according to this invention in a lithography process, exposure is performed with stable exposure intensity, patterns can be accurately formed on a substrate. Accordingly, it is possible to manufacture highly-integrated micro devices with high yield and improved productivity. Therefore, according to another aspect of this invention, there are provided a device manufacturing method using an exposure apparatus or exposure method according to this invention.

BEST MODE FOR CARRYING OUT THE INVENTION

<<A First Embodiment>>

Figure 1:
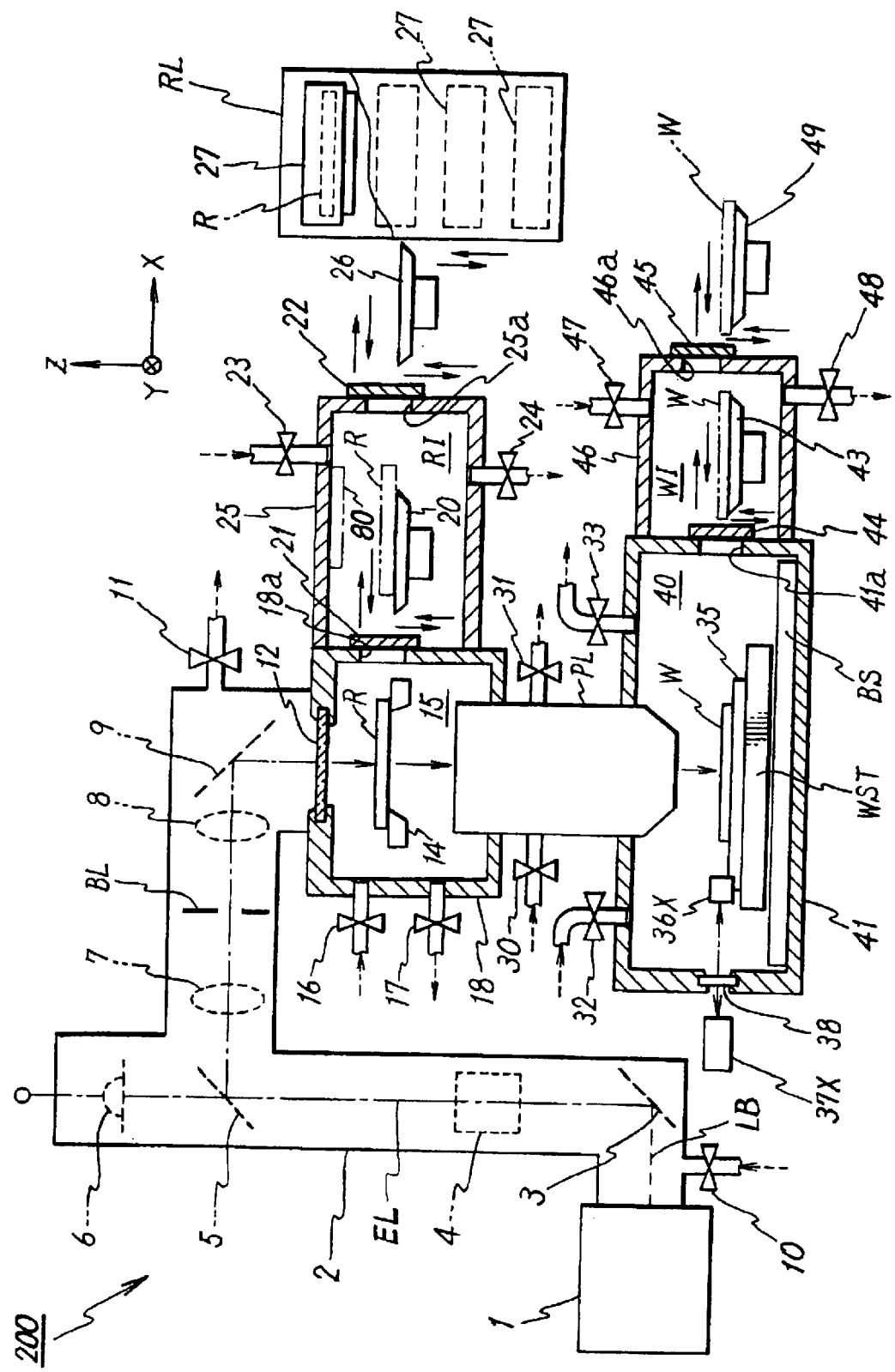
FIG. 1 is a schematic view showing a partial section through an exposure apparatus according to a first embodiment.

An embodiment of the present invention will be described hereinafter on the basis of FIGS. 1 to 4. FIG. 1 shows a schematic arrangement of an exposure apparatus according to a first embodiment of the present invention. This exposure apparatus 200 is a projection exposure apparatus of a step-and-repeat method, a so-called stepper, which illuminates a retilce R as a mask with illumination light EL, for exposure, in the range of vacuum ultraviolet and which transfers a pattern on the reticle onto a wafer W through the projection optical system PL.

This exposure apparatus 200 comprises an illumination system having a light source 1 and a illumination optical system, a reticle holder 14 for holding a reticle R, a projection optical system PL, a wafer stage WST as a substarte stage for holding and moving a wafer W in X-Y two dimensions, transport systems for the reticle R and for the wafer W, and the like.

As the light source 1, vacuum ultraviolet light having a wavelength in the range of about 120 to 180 nm, such as fluorine laser ($F_2$ laser) of oscillation wavelength 157 nm, krypton dimmer laser ($Kr_2$ laser) of oscillation wavelength 146 nm or argon dimmer laser ($Ar_2$ laser) of oscillation wavelength 126 nm. It is noted that an ArF excimer laser of oscillation wavelength 193 nm or the like may be used as the light source.

The illumination optical system includes an illumination system housing 2, a deflection mirror 3 disposed in a predetermined, positional relation inside the housing 2, an optical integrator 4 such as a fly-eye lens, a relay lens, a beam splitter 5 having a large reflectance and a small transmittance, relay lenses 7 and 8, a reticle blind BL as a field stop, a deflection mirror 9, and the like. The reticle blind BL is disposed on a plane conjugate to the pattern surface of the reticle R. In addition, a light-amount monitor 6 constituted by a photoelectric transfer device is disposed in the path of transmitting light of the beam splitter 5.

In the below, the operation of the illumination system will be briefly described. A light beam (laser beam) LB which has a wavelength in the range of vacuum ultraviolet and which is sent out horizontally from the light source 1 is deflected by the deflection mirror 3 through 90 degrees, and made incident on the optical integrator 4. Then the laser beam LB is converted into illumination light EL for exposure having substantially uniform intensity by the optical integrator 4, the illumination light EL being referred to as "exposure light" hereinafter, and most part (e.g. about 97%) thereof is reflected by the beam splitter 5 and illuminates the reticle blind BL with uniform illuminance through the relay lens 7. The exposure light EL that has transmitted through a rectangular opening of the reticle blind BL illuminates a rectangular illumination area, on the reticle R, defined by the opening of the reticle blind BL with uniform illuminance through the relay lens 8, the deflection mirror 9 and a light-transmitting window 12 described later.

The rest (e.g. about 3%) of the illumination light EL, which rest has transmitted through the beam splitter 5, is received by the light-amount monitor 6 and converted into electricity, and the electric signal is supplied to a main controller 100, described later (not shown in FIG. 1; refer to FIG. 2). The main controller 100, from the start of emitting of the light source 1, continuously calculates accumulated exposure amount on the surface of the wafer W through a predetermined computation based on the output of the light-amount monitor 6, and stops emission of the light source 1 at the time when the accumulated exposure amount reaches a predetermined amount (target accumulated exposure amount), which is so-called open exposure amount control. Alternatively, the main controller 100 measures pulse energy emitted from the light source 1 based on output of the light-amount monitor 6 each time a pulse is emitted, and, by controlling the light source 1 in a feed-back manner based on the measured variation of energy, may decrease the variation of emission amount per hour, which is so-called exposure amount control at each pulse. Such exposure amount control at each pulse is disclosed in Japanese Patent Laid-Open No. 3-179357 and U.S. Pat. No. 5,191,374 corresponding thereto, in detail. The disclosures in the above Japanese Patent Laid-Open and U.S. Patent are incorporated herein by reference as long as the national laws in designated states or elected states, to which this international application is applied, permit. Furthermore, exposure amount control of a scan-type exposure apparatus is disclosed in, for example, Japanese Patent Laid-Open No. 8-250402 and U.S. Pat. No. 5,728,495 corresponding thereto. The disclosures in the above Japanese Patent Laid-Open and U.S. Patent are incorporated herein by reference as long as the national laws in designated states or elected states, to which this international application is applied, permit.

It is noted that, when using light having a wavelength in the range of vacuum ultraviolet as the exposure light, gases such as oxygen, moisture and hydro carbon, having a characteristic of absorbing much of the light, need to be removed from the optical path, the gases being each referred to as "absorbent gas" as the need arises. Therefore, in this embodiment the inside of the illumination system housing 2 is filled with specific gas having a characteristic of absorbing little of light having a wavelength in the range of vacuum ultraviolet, such as nitrogen, helium, argon, neon, krypton or mixture gas thereof, the specific gas being referred to as "low absorbent gas" or "specific gas" hereinafter, and the pressure of the inside is set to be a little, e.g. about 1 to 10%, higher than that of the external atmosphere. Hereinafter, the gas pressure, which is about 1 to 10% higher than that of the external atmosphere, is referred to as a "predetermined target pressure" for the sake of convenience.

Figure 3:
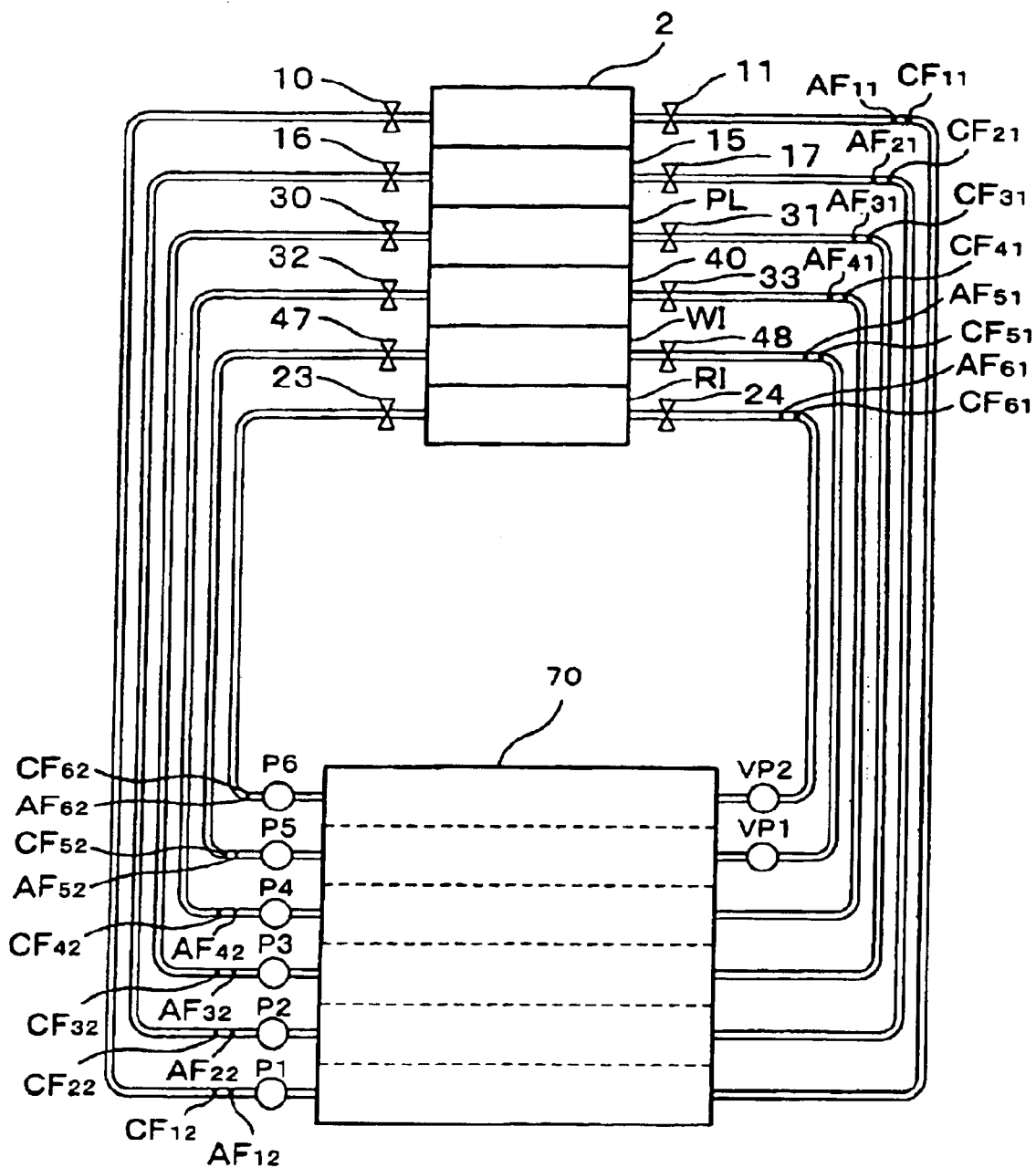
FIG. 3 is a schematic view showing the gas piping system of the apparatus in FIG. 1.

A more detailed description about this will be made in the following. As shown in FIG. 1, a supply valve 10 is provided on an end of the illumination system housing 2, which end is close to the light source 1. On another end farthest away from the supply valve 10, an exhaust valve 11 is provided. As shown in FIG. 3, the supply valve 10 is connected to an end of a first room of a gas supply unit 70 through a supply pipe, and the exhaust valve 11 is connected to the other end of the first room of the gas supply unit 70 through a exhaust pipe. The inside of the gas supply unit 70 is divided into six rooms, the first to sixth, and the rooms are filled with the same low absorbent gas (specific gas). Moreover, the temperature of the specific gas inside each room is controlled to be a predetermined target value by a temperature adjustment unit (not shown).

Furthermore, as shown in FIG. 3, in the exhaust pipe provided with the exhaust valve 11, a filter $AF_{11}$ for removing particles, such as a HEPA filter or ULPA filter, and a chemical filter $CF_{11}$ for removing absorbent gas, such as oxygen and water, and organic pollutant are disposed, the filter $AF_{11}$ being generally referred to as an "air filter". In the same manner as the above, in the supply pipe provided with the supply valve 10, a filter $AF_{12}$ and a chemical filter $CF_{12}$, the same as the chemical filter $CF_{11}$, and a pump P1 are provided.

Figure 2:
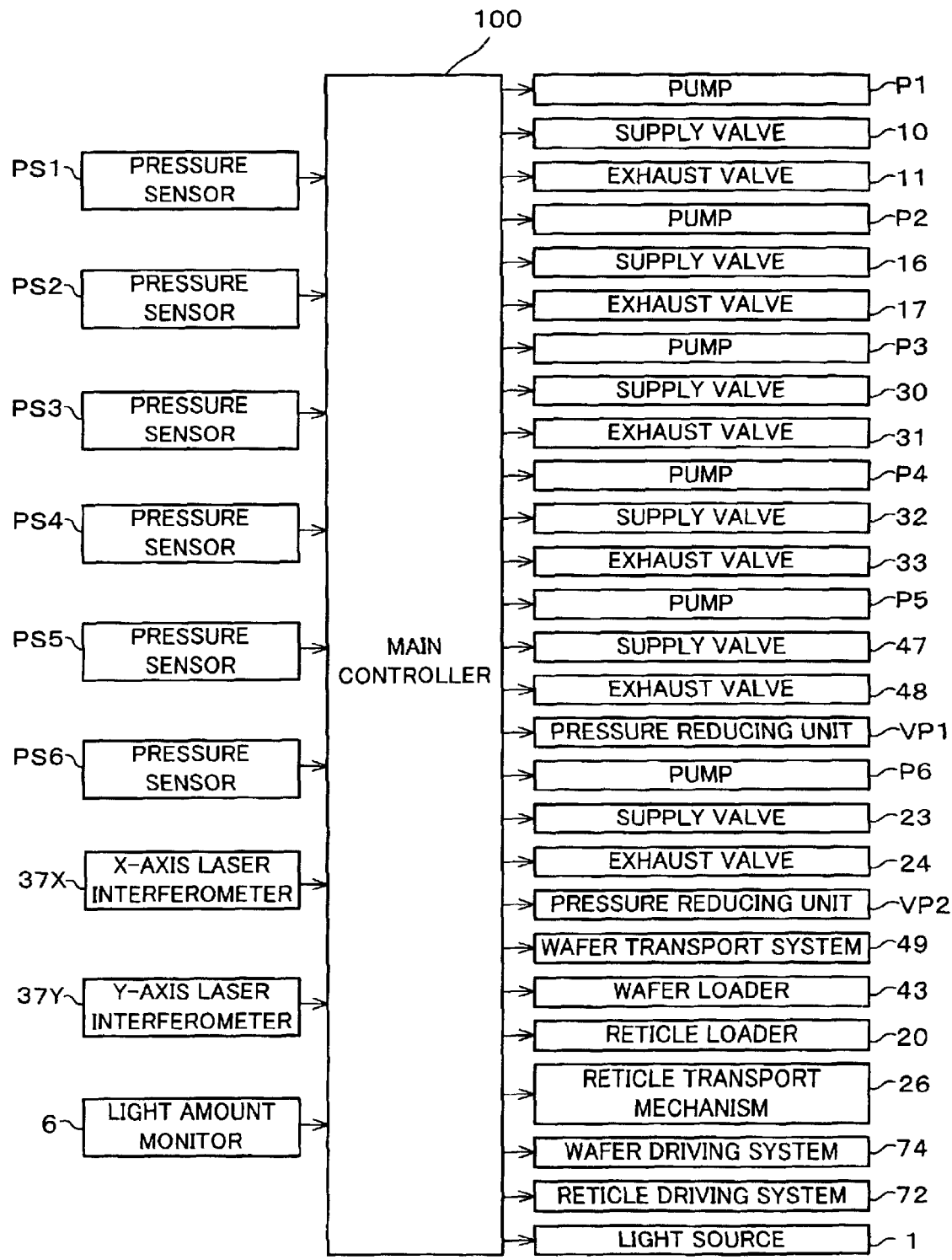
FIG. 2 is a block diagram showing main components of the control system of the apparatus in FIG. 1.

In this embodiment, as shown in FIG. 2, the supply valve 10, the exhaust valve 11 and the pump P1 are connected to the main controller 100. When replacing gas inside the illumination system housing 2, the main controller 100 opens the supply valve 10 and the exhaust valve 11 and operates the pump P1. By this, while the gas supply unit 70 supplies the low absorbent gas (specific gas) to the inside of the illumination system housing 2 through the supply pipe, gas inside the illumination system housing 2 is discharged through the exhaust valve 11 and returns to the gas supply unit 70 through the exhaust pipe. In this manner, the replacement of gas inside the illumination system housing 2 is efficiently performed. In this case, the main controller 100 closes the exhaust valve 11 a predetermined time after the start of operating the pump P1, which time is needed to completely replace gas inside the illumination system housing 2 with the specific gas, and, after the internal pressure that is measured by a pressure sensor PS1 (refer to FIG. 2) reaches the predetermined target pressure, closes the supply valve 10 and stops the pump P1.

In this case, although gas discharged through the exhaust valve 11 contains some amount of impurities (including particles, water, organic pollutant and absorbent gas), almost all of the impurities are removed by the air filter $AF_{11}$ and the chemical filter $CF_{11}$ while returning to the gas supply unit 70 through the exhaust pipe, and the rest of impurities in the specific gas are substantially removed while being supplied to the illumination system housing 2 through the supply pipe by the gas supply unit 70. And the concentration of impurities in the specific gas in the illumination system housing 2 is controlled to be smaller than a predetermined first value. Specifically, the first concentration means about 1 to 10 ppb for organic pollutant, about 10 to 100 ppb for water and about 30 to 300 ppb for absorbent gas such as oxygen. That is, chemical filters $CF_{11}$, $CF_{12}$ having a capability of keeping the concentration of each impurity within a respective first concentration range are used, and the main controller 100 controls the pump P1, the exhaust valve 11 and the supply valve 10.

Accordingly, even if the specific gas is in circulation for long hours, it hardly has a bad influence on exposure. It is noted that the main controller 100 may determine the time to stop the operation of the pump P1 based on the output of a gas sensor (not shown) for sensing the concentration of the absorbent gas or the specific gas in the illumination system housing 2. Alternatively, since the specific gas filling the illumination system housing 2 is in circulation, the specific gas may be made to continuously flow through the illumination system housing 2.

The reason why the internal pressure of the specific gas in the illumination system housing 2 is kept being the predetermined value is that, although keeping the internal pressure higher than that of the external atmosphere is desirable from the viewpoint of preventing the external atmosphere from leaking into the inside, setting the internal pressure to be too high will cause the illumination system housing 2 to become heavier to support the difference of the pressures. However, if the strength of the floor on which the exposure apparatus is provided is enough to support a heavier apparatus, decreasing the pressure inside the illumination system housing 2 down to about 0.1 hPa and then filling it with low absorbent gas produces better efficiency. In this case, a supply and exhaust system is used which has a capability of keeping the concentration of impurities in the specific gas within the first concentration range.

The reticle holder 14 that holds a reticle R by vacuum chucking is disposed in a reticle room 15 as a mask room. The reticle room 15 is surrounded by a division wall 18 that is joined to the illumination system housing 2 and the barrel of the projection optical system PL without any gap, and gas therein is separated from the external atmosphere. The division wall 18 of the reticle room 15 is made of a material that emits little gas, such as stainless (SUS).

On the ceiling of the division wall 18 of the reticle room 15, a rectangular opening is made which is a little smaller than the reticle R, and into which a transmission window 12 is fitted so as to separate the insides of the illumination system housing 2 and the reticle room 15 in which the reticle R is arranged. Because the transmission window 12 is disposed in the optical path of exposure light EL radiated from the illumination optical system to the reticle R, the transmission window 12 is made of a crystal material, such as fluorite, having high transmittance to vacuum ultraviolet as the exposure light.

It is noted that if gas inside the illumination system housing 2 is replaced after the operation of decreasing pressure, the transmission window 12 made of fluorite may be broken by the pressure difference upon the operation. Therefore, a movable metal pressure-proof lid may be provided on the transmission window 12 so as to protect it from the pressure difference.

The reticle holder 14 is constructed so as to be finely driven in a X-Y plane by a reticle driving system 72 (not shown in FIG. 1; refer to FIG. 2), and the reticle driving system 72 comprises two pairs of voice coil motors.

In an exposure apparatus using exposure light having a wavelength in the range of vacuum ultraviolet, the atmosphere near the reticle R also needs to be replaced by the specific gas so as to avoid the absorption of the exposure light by absorbent gas such as oxygen. Accordingly, in this embodiment the inside of the reticle room 15 is filled with the specific gas, and the gas pressure is set to be the predetermined target value.

A more detailed description about this will be made in the following. On the division wall 18 of the reticle room 15, as shown in FIG. 1, a supply valve 16 and an exhaust valve 17 are provided. As shown in FIG. 3, the supply valve 16 is connected to an end of a second room of the gas supply unit 70 through a supply pipe, and the exhaust valve 17 is connected to the other end of the second room of the gas supply unit 70 through an exhaust pipe. Furthermore, in the exhaust pipe provided with the exhaust valve 17, a filter $AF_{21}$ for removing particles and a chemical filter $CF_{21}$ for removing absorbent gas, such as oxygen, and organic pollutants are disposed. Moreover, in the supply pipe provided with the supply valve 16, a filter $AF_{22}$, a chemical filter $CF_{22}$, the same as the chemical filter $CF_{21}$, and a pump P2 are provided. In addition, the internal pressure of the reticle room 15 is measured by a pressure sensor PS2 (refer to FIG. 2). As shown in FIG. 2, the supply valve 16, the exhaust valve 17, the pump P2 and the pressure sensor PS2 are connected to the main controller 100. In the same manner as in the above gas replacement inside the illumination system housing 2, the main controller 100, by opening and closing the supply valve 16 and the exhaust valve 17 and operating the pump P2, efficiently replaces gas inside the reticle room 15 while monitoring the output of the pressure sensor PS2. In this case, the concentration of impurities (including particles, water, organic pollutant and absorbent gas such as oxygen) in the specific gas inside the reticle room 15 is kept being within the first concentration range. That is, chemical filters $CF_{21}$, $CF_{22}$ having a capability of keeping the concentration of each impurity within a respective first concentration range are used, and the main controller 100 controls the pump P2, the exhaust valve 17 and the supply valve 16.

Also in this case, because the air filters and chemical filters in the supply and exhaust pipes remove substantially all the impurities of the gas, it hardly has a bad influence on exposure, even if the specific gas is in circulation for long hours.

Moreover, the main controller 100 may determine the time to stop the operation of the pump P2 based on the output of a gas sensor, or make the specific gas to continuously flow through the reticle room 15.

The reason why the inside of the reticle room 15 is kept being not vacuum but at the predetermined pressure is the same as with the illumination system housing 2 described above. Therefore, if the increase of the weight is permitted, decreasing the pressure inside the reticle room 15 and then filling the inside with low absorbent gas may be performed upon the replacement of the gas therein.

The projection optical system PL comprises an optical system having lenses and reflection mirrors, which are made of fluorite or fluoride crystal such as lithium fluoride, and a barrel enclosing them. In this embodiment, a reduction optical system having a reduction ratio $\beta$ of, e.g., ¼ or ⅕ is used as the projection optical system PL. Accordingly, as mentioned above, exposure light EL from the illumination system illuminates the reticle R; a pattern formed on the reticle R is reduced and transferred onto a shot area on a wafer W by the projection optical system PL, and the reduced image of the pattern is formed thereon.

In an exposure apparatus using exposure light having a wavelength in the range of vacuum ultraviolet, the atmosphere inside the barrel of the projection optical system PL also needs to be replaced by the low absorbent gas (the specific gas) so as to avoid the absorption of the exposure light by absorbent gas such as oxygen. Accordingly, in this embodiment the inside of the barrel of the projection optical system PL is filled with the specific gas, and the gas pressure is set to be the predetermined target value.

A more detailed description about this will be made in the following. On the barrel of the projection optical system PL, as shown in FIG. 1, a supply valve 30 and an exhaust valve 31 are provided. As shown in FIG. 3, the supply valve 30 is connected to an end of a third room of the gas supply unit 70 through a supply pipe, and the exhaust valve 31 is connected to the other end of the third room of the gas supply unit 70 through an exhaust pipe. Furthermore, in the exhaust pipe provided with the exhaust valve 31, a filter $AF_{31}$ for removing particles and a chemical filter $CF_{31}$ for removing absorbent gas, such as oxygen, and organic pollutants are disposed. Moreover, in the supply pipe provided with the supply valve 16, a filter $AF_{32}$, a chemical filter $CF_{32}$, the same as the chemical filter $CF_{31}$, and a pump P3 are provided. In addition, the internal pressure of the barrel of the projection optical system PL is measured by a pressure sensor PS3 (refer to FIG. 2). As shown in FIG. 2, the supply valve 30, the exhaust valve 31, the pump P3 and the pressure sensor PS3 are connected to the main controller 100. In the same manner as in the above gas replacement inside the illumination system housing 2, the main controller 100, by opening and closing the supply valve 30 and the exhaust valve 31 and operating the pump P3, efficiently replaces gas inside the barrel of the projection optical system PL while monitoring the output of the pressure sensor PS2. In this case, the concentration of impurities (including particles, water, organic pollutant and absorbent gas such as oxygen) in the specific gas inside the barrel of the projection optical system PL is kept being within the first concentration range. That is, chemical filters $CF_{31}$, $CF_{32}$ having a capability of keeping the concentration of each impurity within a respective first concentration range are used, and the main controller 100 controls the pump P3, the exhaust valve 31 and the supply valve 30.

Also in this case, because the air filters and chemical filters in the supply and exhaust pipes remove substantially all the impurities of the gas, it hardly has a bad influence on exposure, even if the specific gas is in circulation for long hours.

Moreover, the main controller 100 may determine the time to stop the operation of the pump P3 based on the output of a gas sensor, or make the specific gas to continuously flow through the barrel of the projection optical system PL.

The reason why the inside of the barrel of the projection optical system PL is kept being at the predetermined pressure is the same as the above, and the reason why it is not kept being vacuum is that because such vacuum will cause a large pressure difference between the inside and outside of the barrel, the barrel needs to have a structure strong enough to endure the pressure difference, which causes the barrel and thus the apparatus to become heavier and larger. However, if the increase of the weight is permitted, decreasing the pressure inside the projection optical system PL and then filling the inside with low absorbent gas may be performed upon the replacement of the gas therein.

The wafer stage WST is disposed in a wafer room 40 as a substrate room. The wafer room 40 is surrounded by a division wall 41 that is joined to the barrel of the projection optical system PL without any gap, and gas therein is separated from the external atmosphere. The division wall 41 of the wafer room 40 is made of a material that emits little gas, such as stainless (SUS).

The wafer stage WST is constructed so as to be freely driven on the upper surface of a base BS and in the X-Y plane in non-contact by a wafer driving system 74 (not shown in FIG. 1, refer to FIG. 2) that consists of a magnetic-levitation-type two-dimensional linear actuator (a planar motor) and the like.

A wafer holder 35 is mounted on the wafer stage WST, and the wafer holder 35 holds a wafer W by vacuum chucking.

By the wafer holder 35 moving in the X-Y plane, any shot area on the wafer W can be aligned with respect to a projection position (exposure position) of a reticle pattern, and the reticle pattern can be projected and transferred onto the shot area. That is, in the exposure apparatus 200, the main controller 100 repeats the stepping-between-shots operation of moving the wafer stage WST so as to sequentially align each shot area on the wafer W with respect to the exposure position and the exposure operation of transferring the reticle pattern onto the shot area at the aligned position by illuminating the reticle R with exposure light EL.

In an exposure apparatus using exposure light having a wavelength in the range of vacuum ultraviolet, the atmosphere in the optical path from the projection optical system PL to the wafer W also needs to be replaced by the low absorbent gas (the specific gas) so as to avoid the absorption of the exposure light by absorbent gas such as oxygen. Accordingly, in this embodiment the inside of the wafer room 40 is filled with the specific gas, and the gas pressure is set to be the predetermined target value.

A more detailed description about this will be made in the following. On the division wall 41 of the wafer room 40, as shown in FIG. 1, a supply valve 32 and an exhaust valve 33 are provided. As shown in FIG. 3, the supply valve 32 is connected to an end of a fourth room of the gas supply unit 70 through a supply pipe, and the exhaust valve 33 is connected to the other end of the fourth room of the gas supply unit 70 through an exhaust pipe. Furthermore, in the exhaust pipe provided with the exhaust valve 33, a filter $AF_{41}$ for removing particles and a chemical filter $CF_{41}$ for removing absorbent gas and organic pollutants are disposed. Moreover, in the supply pipe provided with the supply valve 32, a filter $AF_{42}$, a chemical filter $CF_{42}$, the same as the chemical filter $CF_{41}$, and a pump P4 are provided. In addition, the internal pressure of the wafer room 40 is measured by a pressure sensor PS4 (refer to FIG. 2). As shown in FIG. 2, the supply valve 32, the exhaust valve 33, the pump P4 and the pressure sensor PS4 are connected to the main controller 100. In the same manner as in the above gas replacement inside the illumination system housing 2, the main controller 100, by opening and closing the supply valve 32 and the exhaust valve 33 and operating the pump P4, efficiently replaces gas inside the wafer room 40 while monitoring the output of the pressure sensor PS2. In this case, the concentration of impurities (including particles, water, organic pollutant and absorbent gas such as oxygen) in the specific gas inside the wafer room 40 is kept being within the first concentration range. That is, chemical filters $CF_{41}$, $CF_{42}$ having a capability of keeping the concentration of each impurity within a respective first concentration range are used, and the main controller 100 controls the pump P4, the exhaust valve 33 and the supply valve 32.

Also in this case, because the air filters $AF_{41}$, $AF_{42}$ and chemical filters $CF_{41}$, $CF_{42}$ remove substantially all the impurities of the gas, it hardly has a bad influence on exposure, even if the specific gas is in circulation for long hours.

Moreover, the main controller 100 may determine the time to stop the operation of the pump P4 based on the output of a gas sensor, or make the specific gas to continuously flow through the wafer room 40.

The reason why the inside of the wafer room 40 is kept being not vacuum but at the predetermined pressure is the same as with the illumination system housing 2.

On the sidewall in the −X direction of the division wall 41 of the wafer room 40, a light transmission window 3B is provided. In the same manner as this, also on the sidewall in the +Y direction of the division wall 41, a light transmission window is provided, the +Y direction being toward the backside in FIG. 1. These light transmission windows are constituted by light transmission members that are fitted into openings made in the division wall 41, closing the openings and that are made of usual optical glass. In this case, so as to prevent leakage of gas from joints of the openings and the light transmission members constituting the light transmission windows 38, the joints are sealed by metal seals such as indium or copper, or fluorine resin.

On the end in the −X direction of the wafer holder 35, an X-movable mirror 36X extends in the Y-direction that is constituted by a flat mirror. A measurement beam from an X-axis laser interferometer 37X is directed substantially perpendicular to the X-movable mirror 36X through the light transmission window 38, the interferometer 37X being placed outside the wafer room 40; the reflected light is received through the light transmission window 38 by a detector inside the interferometer 37X, and the position of the X-movable mirror 36X, i.e. the X-position of the wafer W, is detected with respect to the position of a reference mirror inside the interferometer 37X.

In the same manner, on the end in the +Y direction of the wafer holder 35, a Y-movable mirror (not shown) extends in the Y-direction that is constituted by a flat mirror. And in the same manner as the above, the position of the Y-movable mirror, i.e. the Y-position of the wafer W, is detected by a Y-axis laser interferometer 37Y (refer to FIG. 2). The readings (measurement values) of the interferometers 37X, 37Y are supplied to the main controller 100 (refer to FIG. 2), and upon stepping between shots or the like, the main controller 100 controls the position of the wafer stage WST via the wafer driving system 74, monitoring the readings of the interferometers 37X, 37Y.

As described above, in this embodiment because the interferometers 37X, 37Y, i.e. optical members such as laser sources and prisms, and detectors, are disposed outside the wafer room 40, even if a trace of absorbent gas is emitted from the detectors of the interferometers 37X, 37Y, it does not affect exposure.

It is noted that the outside of the wafer room 40, i.e., the optical path of the measurement beam outwards from the light transmission window 38 may be covered by a container having light transmission windows on both ends thereof and that the temperature and pressure of gas inside the container may be controlled. Alternatively, the inside of the container may be made to be vacuum. By this, measurement errors due to the air fluctuation in the external optical path can be decreased. This is disclosed in detail in, for example, Japanese Patent Laid-Open No. 10-281716.

Incidentally, fixing reference mirrors of laser interferometers on the projection optical system PL and measuring the positions of the X-movable mirror 36X and Y-movable mirror using the reference mirrors as references is common practice. In this case, optical elements which include a polarized-beam splitter (prism) for separating reference and measurement beams and which may include other elements following the prism may be contained in the wafer room 40, and the laser light source, detector, etc., may be disposed outside the wafer room 40.

Moreover, after the wafer W subject to exposure is carried into the exposure apparatus (specifically the wafer room 40) and mounted on the wafer holder 35, exposure is performed, and then the wafer W is carried out of the exposure apparatus. Meanwhile, because the atmosphere outside the exposure apparatus is the normal air, the atmosphere having oxygen, about 21%, which absorbs much of vacuum ultraviolet light. Therefore, if, upon carrying in and out the wafer W, the external atmosphere gets into the wafer room 40 even by a small amount, unallowable decrease and variation of transmittance are caused because of the considerable absorption of exposure light EL.

In this embodiment, so as to prevent the occurrence of such problem, the following method is adopted.

That is, as shown in FIG. 1, a wafer-gas-replacement room WI as a reserve room for substrates is disposed adjacent to the wafer room 40. The wafer-gas-replacement room WI is formed by a division wall 46 and the sidewall in the +X direction of the division wall 41 of the wafer room 40. A gate 41a is made in the sidewall in the +X direction of the division wall 41, and can be opened and closed by a door 44. Also, a gate 46a is made in the sidewall in the +X direction of the division wall 46, and can be opened and closed by a door 45. The main controller 100 opens and closes the doors 44, 45 via a driving unit (not shown). Preferably at least the door 44 out of the doors 44, 45 is a mechanical shutter, which can open and close at high speed.

As shown in FIG. 1, a supply valve 47 and an exhaust valve 48 are provided on the division wall 46 of the wafer-gas-replacement room WI. As shown in FIG. 3, the supply valve 47 is connected to an end of a fifth room of the gas supply unit 70 through a supply pipe, and the exhaust valve 48 is connected to the other end of the fifth room of the gas supply unit 70 through an exhaust pipe. Furthermore, in the exhaust pipe provided with the exhaust valve 48, a filter $AF_{51}$ for removing particles, a chemical filter $CF_{51}$ for removing absorbent gas and organic pollutants, and a pressure-reducing unit VP1 constituted by a vacuum pump such as a dry pump are disposed. In the supply pipe provided with the supply valve 47, a filter $AF_{52}$, a chemical filter $CF_{52}$, the same as the chemical filter $CF_{51}$, and a pump P5 are provided. The internal pressure of the wafer-gas-replacement room WI is measured by a pressure sensor PS5 (refer to FIG. 2). As shown in FIG. 2, the supply valve 47, the exhaust valve 48, the pressure-reducing unit VP1, the pump P5 and the pressure sensor PS5 are connected to the main controller 100.

A wafer loader 43 that is constituted by a robot arm carrying a wafer W into and out of the wafer room 40 through the gate 41a and that serves as a substrate transport system is disposed inside the wafer-gas-replacement room WI. Outside the door 45, a wafer transport system 49 that is constituted by a robot arm carrying the wafer W into and out of the wafer-gas-replacement room WI through the gate 46a is disposed. The wafer loader 43 and wafer transport system 49 are electrically connected to the main controller 100 (refer to FIG. 2).

Next, the sequence of transferring the wafer W from the outside of the exposure apparatus into the wafer room 40 will be described mainly focusing on the control operation by the main controller 100.

(1) First, after an external transport system (not shown) transfers the wafer w from the outside of the exposure apparatus onto a wafer pre-alignment unit (not shown), the main controller 100 performs rough alignment (pre-alignment) using the shape of the wafer W as a reference. The pre-alignment is an operation of detecting at least three point, on the periphery, including the notch (V-shaped cut) of the wafer W via optical sensors and thus X-Y position deviation and angle deviation of the wafer and correcting these deviations with the pre-alignment unit, or an operation of simultaneously moving a plurality of driving pins inwards in the radius direction, having one of the driving pins fit the notch and performing alignment of the center and angle of the wafer W.

(2) Next, the main controller 100 receives the pre-aligned wafer using the wafer transport system 49, and begins to transfer it toward the wafer-gas-replacement room WI. Then the main controller 100 opens the door 45 when the wafer transport system 49 with the wafer W has arrived within a predetermined distance from the wafer-gas-replacement room WI. At this time the gate 41a has been closed by the door 44, which gate 41a is on the boundary between the wafer-gas-replacement room WI and the wafer room 40.

(3) Next, the main controller 100 makes the wafer transport system 49 with the wafer W enter the wafer-gas-replacement room WI through the gate 46a, and the wafer transport system 49 passes the wafer W to the wafer loader 43.

Because when the wafer transport system 49 gets into the wafer-gas-replacement room WI, the outside door 45 thereof is open, the external atmosphere gets into the wafer-gas-replacement room WI along with the wafer W. However, impurities in the external atmosphere, such as absorbent gas, e.g. oxygen, and organic pollutants do not get into the wafer room 40 because the inside door 44 is closed.

(4) After the transfer of the wafer W, the main controller 100 moves back the wafer transport system 49 through the gate 46a to the outside of the wafer-gas-replacement room WI, and closes the door 45.

(5) Next, the main controller 100 opens the exhaust valve 48, operates the pressure-reducing unit VP1 and begins to decrease the pressure inside the wafer-gas-replacement room WI. And the main controller 100 monitors the readings of the pressure sensor PS5, and when the pressure inside the wafer-gas-replacement room WI has dropped to, e.g., about 0.1 hPa, closes the exhaust valve 48 and stops the pressure-reducing unit VP1.

By the above pressure decrease, pollutants such as absorbent gas, e.g. oxygen, are removed from inside the wafer-gas-replacement room WI.

(6) After that, the main controller 100 simultaneously opens the supply valve 47 and starts to operate the pump P5. By this, the gas supply unit 70 starts supplying the low absorbent gas (the specific gas) to inside the wafer-gas-replacement room WI. After the start of supplying the low absorbent gas, the main controller 100, when it finds based on the readings of the pressure sensor PS5 that the internal pressure has reached the predetermined value, closes the supply valve 47 and stops the pump P5. By this, the replacement of gas inside the wafer-gas-replacement room WI is completed. At the completion of gas replacement, the concentration of impurities in the specific gas inside the wafer-gas-replacement room WI has become about 10 to 100 times the first concentration (a second concentration).

(7) After that, the main controller 100 opens the door 44 and transfers the wafer W onto the wafer holder 35 in the wafer room 40 through the gate 41a with the wafer loader 43, and then returns the wafer loader 43 to inside the wafer-gas-replacement room WI through the gate 41a and closes the door 44. In this case, because the door 44 is a high speed shutter, the door 44 can be opened and closed at high speed, and the time for which the door 44 is open can be shortened.

Then, exposure is performed to the wafer W on the wafer holder 35 in the procedure described above. After the completion of exposure of the wafer W, the wafer W already exposed is transferred from the wafer room 40 to outside the exposure apparatus in the following sequence (8), (9).

(8) First, the main controller 100 opens the door 44, moves the wafer loader 43 to inside the wafer room 40 through the gate 41a, unloads the wafer W from the wafer holder 35, returns the wafer loader 43 with the wafer W to inside the wafer-gas-replacement room WI through the gate 41a, and closes the door 44. Also upon the unload of the wafer, the door 44 can be opened and closed at high speed, and the time for which the door 44 is open can be shortened.

(9) Next, the main controller 100 opens the door 45, makes the wafer transport system 49 enter the wafer-gas-replacement room WI through the gate 46a, and the wafer loader 43 passes the wafer W to the wafer transport system 49. After the passing of the wafer, the main controller 100 moves back the wafer transport system 49 with the wafer W through the gate 46a to outside the wafer-gas-replacement room WI and closes the door 45.

After that, the wafer transport system 49 carries the wafer W to the external transport system, and then the external transport system transports it to outside the apparatus.

According to the above sequence (1) through (9), the replacement of a wafer upon which absorbent gas and the like are prevented from getting into the wafer room 40 is possible. By this, the decrease and variation of transmittance due to the absorption of exposure light EL by absorbent gas and the like can be effectively suppressed, the absorbent gas and the like having got into the wafer room upon carrying a wafer into and out of the wafer room 40.

Moreover, because the pressure inside the wafer-gas-replacement room WI is decreased in the step (5), even if water is sticking to the wafer front or back surface upon carrying the wafer W into the wafer room 40 from outside, the decreasing of the internal pressure removes almost all thereof from the wafer W. Therefore, water sticking to the wafer can be prevented from polluting the wafer room 40. In addition, it is possible to prevent a layer of water sticking to the wafer W from absorbing exposure light EL and being resolved causing necessary exposure amount to increase and thus real exposure amount to be unstable.

Also when carrying in and out a reticle R, even if a small amount of the external atmosphere gets into the reticle room 15 along with the reticle R, considerable absorption of exposure light EL occurs causing unallowable decrease and variation of transmittance.

In this embodiment, so as to prevent the occurrence of such problem, the following method is adopted.

That is, as shown in FIG. 1, a reticle-gas-replacement room RI as a reserve room for reticles is disposed adjacent to the reticle room 15. The reticle-gas-replacement room RI is formed by a division wall 25 and the sidewall in the +X direction of the division wall 18 of the reticle room 15. A gate 18a is made in the sidewall in the +X direction of the division wall 18, and can be opened and closed by a door 21. Also, a gate 25a is made in the sidewall in the +X direction of the division wall 25, and can be opened and closed by a door 22. The main controller 100 opens and closes the doors 21, 22 via a driving unit (not shown). Preferably at least the door 21 out of the doors 21, 22 is a mechanical shutter, which can open and close at high speed.

As shown in FIG. 1, a supply valve 23 and an exhaust valve 24 are provided on the division wall 25 of the reticle-gas-replacement room RI. As shown in FIG. 3, the supply valve 23 is connected to an end of a sixth room of the gas supply unit 70 through a supply pipe, and the exhaust valve 24 is connected to the other end of the sixth room of the gas supply unit 70 through an exhaust pipe. Furthermore, in the exhaust pipe provided with the exhaust valve 24, a filter $AF_{61}$ for removing particles, a chemical filter $CF_{61}$ for removing absorbent gas and organic pollutants, and a pressure-reducing unit VP2 constituted by a vacuum pump such as a dry pump are disposed. In the supply pipe provided with the supply valve 23, a filter $AF_{62}$, a chemical filter $CF_{62}$, the same as the chemical filter $CF_{61}$, and a pump P6 are provided. The internal pressure of the reticle-gas-replacement room RI is measured by a pressure sensor PS6 (refer to FIG. 2). As shown in FIG. 2, the supply valve 23, the exhaust valve 24, the pressure-reducing unit VP2, the pump P6 and the pressure sensor PS6 are connected to the main controller 100.

A reticle loader 20 that is constituted by a robot arm carrying a reticle R into and out of the reticle room 15 through the gate 18a and that serves as a mask transport system is disposed inside the reticle-gas-replacement room RI. Outside the door 22, a reticle-transport mechanism 26 that is constituted by a robot arm carrying the reticle R into and out of the reticle-gas-replacement room RI through the gate 25a is disposed, the reticle R being stored in a reticle library RL as a mask store portion. The reticle loader 20 and reticle-transport mechanism 26 are electrically connected to the main controller 100 (refer to FIG. 2).

The reticle library RL has a plurality of racks, in each of which a reticle case 27 containing a reticle R is stored. As the reticle case 27, a non-sealed-type reticle carrier is used. Because, actually, all elements in FIG. 1 except for the light source 1 are enclosed by an environment-chamber (not shown) where the temperature, humidity, etc., are accurately controlled, there is no problem about using a non-sealed-type reticle carrier as the reticle case.

Incidentally, a transparent, thin film for protecting against dust, referred to as a pellicle, is usually attached to the pattern side of the reticle R. In this embodiment, a reticle means a reticle coated with a pellicle, hereinafter.

Figure 4A:
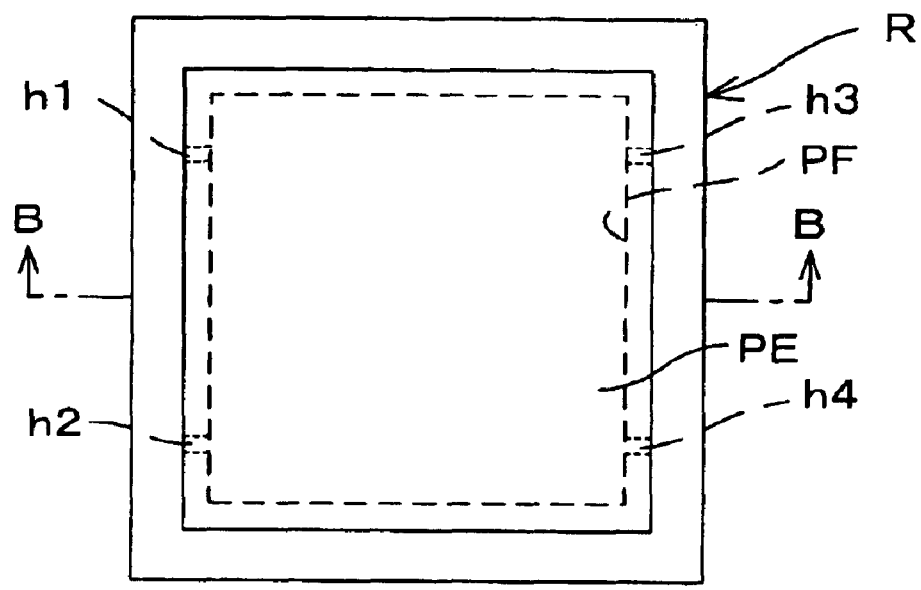
FIG. 4A is a plan view of reticle R with the pattern surface facing up.
Figure 4B:
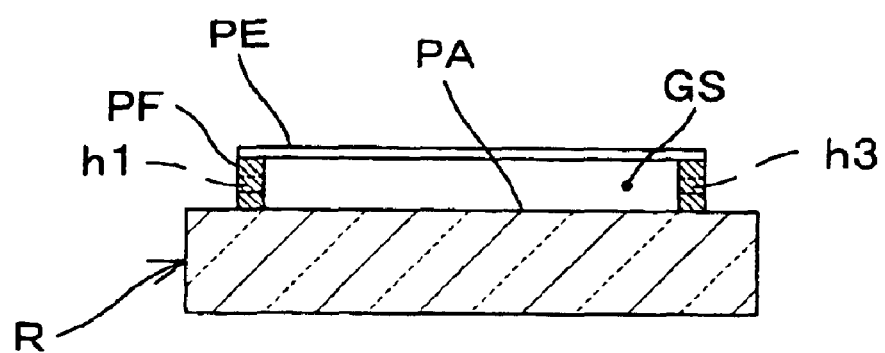
FIG. 4B is a cross-sectional view taken along line B-B in FIG. 4A.

FIG. 4A shows a plan view of the reticle R with the pattern surface facing up, and FIG. 4B shows a cross-sectional view taken along B-B line in FIG. 4A. As shown in FIG. 4B, a pellicle PE is attached to the pattern surface PA of the reticle R via a metal frame PF, referred to as a pellicle frame or pellicle stand. Although the pellicle PE is usually a transparent, thin film made from nitrocellulose and the like, in this embodiment a film made from a crystal material such as fluorite, magnesium fluoride or lithium fluoride, from which reticles and lenses are made, may be used so as to transmit exposure light EL having a wavelength in the range of 120 to 180 nm (vacuum ultraviolet).

There is, as shown in FIG. 4B, a space GS containing a predetermined amount of gas between the pellicle PE and the pattern surface PA. If the space GS is airtight, and when the pressure of the atmosphere drops due to a typhoon approaching, the gas inside the space GS expands and breaks the pellicle PE. Therefore, the metal frame PF has gas vents h1, h2, h3, h4 made therein.

Next, the sequence of transferring a reticle R from the reticle library RL to the reticle room 15 will be described in the following mainly focusing on the control operation of the main controller 100.

a. First, the main controller 100 removes the reticle R contained in the reticle case 27 from the reticle case 27 in the reticle library RL via the reticle-transport mechanism 26, and starts to transfer it toward the reticle-gas-replacement room RI. And the main controller 100 opens the door 22 when the reticle-transport mechanism 26 holding the reticel R arrives within a predetermined distance from the reticle-gas-replacement room RI. At this time the gate 18*a* has been closed by the door 21, which gate 18*a* is on the boundary between the reticle-gas-replacement room RI and the reticle room 15.

b. Next, the main controller 100 makes the reticle-transport mechanism 26 with the reticle R enter the reticle-gas-replacement room RI through the gate 25*a*, and the reticle-transport mechanism 26 passes the reticle R to the reticle loader 20.

Because when the reticle-transport mechanism 26 gets into the reticle-gas-replacement room RI, the outside door 22 thereof is open, the external atmosphere gets into the reticle-gas-replacement room RI along with the reticle R. However, absorbent gas, such as oxygen, and so forth in the external atmosphere do not get into the reticle room 15 because the inside door 21 is closed.

c. After the transfer of the reticle R, the main controller 100 moves back the reticle-transport mechanism 26 through the gate 25*a* to the outside of the reticle-gas-replacement room RI, and closes the door 22.

d. Next, the main controller 100 opens the exhaust valve 24, operates the pressure-reducing unit VP2 and begins to decrease the pressure inside the reticle-gas-replacement room RI. And the main controller 100 monitors the readings of the pressure sensor PS6, and when the pressure inside the reticle-gas-replacement room RI has dropped to, e.g., about 0.1 hPa, closes the exhaust valve 24 and stops the pressure-reducing unit VP2.

By the above pressure decrease, absorbent gas, such as oxygen, and so forth are removed from inside the reticle-gas-replacement room RI.

e. After that, the main controller 100 simultaneously opens the supply valve 23 and starts to operate the pump PS6. By this, the gas supply unit 70 starts supplying the low absorbent gas to inside the reticle-gas-replacement room RI. After the start of supplying the low absorbent gas, the main controller 100, when it finds based on the readings of the pressure sensor PS6 that the internal pressure has reached almost the same value as inside the reticle room 15, closes the supply valve 23 and stops the pump P6. By this, replacing gas inside the reticle-gas-replacement room RI with the low absorbent gas is completed. At the completion of gas replacement, the concentration of impurities in the specific gas inside the reticle-gas-replacement room RI has become about 10 times the first concentration (a second concentration).

In this case, the main controller 100 spends more than 10 seconds from the start of decreasing the pressure to the completion of replacement. Accordingly, substantially no pressure difference occurs between the inside and outside of the pellicle PE because the pressure-drop in the reticle-gas-replacement room RI and, then, the charging of low absorbent gas slowly take place with gas passing through the gas vents h1 to h4. Therefore, the pellicle is not damaged.

It is remarked that because the replacements of a reticle are less in frequency than those of a wafer, such slow gas-replacement has little influence on the throughput of the exposure apparatus.

In this case, it is desirable that as the exhaust valve 24 and the supply valve 23, flow-amount adjustment valves be used which can adjust the gas-discharge and gas-charge speeds individually.

Also in the pressure decrease of the wafer-gas-replacement room WI, because too rapid decrease of the pressure may cause moisture contained in the inside gas to freeze and stick to the wafer surface because of adiabatic expansion cooling, it is desirable that the pressure decrease operation upon the wafer replacement be performed as slowly as possible below the limit for not decreasing the throughput of the exposure apparatus. Also in this case, it is desirable that as the exhaust valve 48, a flow-amount adjustment valve be used which can adjust the pressure-decrease speed.

f. After the completion of gas replacement, the main controller 100 opens the door 21 and transfers the reticle R onto the reticle holder 14 in the reticle room 15 with the reticle loader 20, and then returns the reticle loader 20 to inside the reticle-gas-replacement room RI through the gate 18*a* and closes the door 21. In this case, because the door 21 is a high speed shutter, the door 21 can be opened and closed at high speed, and the time for which the door 21 is open can be shortened.

Meanwhile, the reticle R is transferred from the reticle room 15 in the following way.

g. First, the main controller 100 opens the door 21, moves the reticle loader 20 to inside the reticle room 15 through the gate 18*a*, unloads the reticle R from the reticle holder 14, returns the reticle loader 20 with the reticle R to inside the reticle-gas-replacement room RI through the gate 18*a*, and closes the door 21. Also upon the unload of the reticle, the door 21 can be opened and closed at high speed, and the time for which the door 21 is open can be shortened.

h. Next, the main controller 100 opens the door 22, makes the reticle-transport mechanism 26 enter the reticle-gas-replacement room RI through the gate 25*a*, and the reticle loader 20 passes the reticle R to the reticle-transport mechanism 26. After the passing of the reticle, the main controller 100 moves back the reticle-transport mechanism 26 with the reticle R through the gate 25*a* to outside the reticle-gas-replacement room RI and closes the door 22. After that, the main controller 100 controls the reticle-transport mechanism 26 to return the reticle R to inside the reticle case 27 located at a predetermined rack of the reticle library RL.

It is noted that although, in this embodiment, absorbent gas of the same kind is supplied to all of the illumination system housing 2, the reticle room 15, the barrel of the projection optical system PL, the wafer room 40, the wafer-gas-replacement room WI and the reticle-gas-replacement room RI and circulated without necessitating preparing several kind of gases, different kinds of gases may be used as absorbent gases supplied to respective elements. It is remarked that in such a case, gases supplied to the wafer room 40 and the wafer-gas-replacement room WI should be of the same kind and that gases supplied to the reticle room 15 and the reticle-gas-replacement room RI should also be of the same kind to avoid the mixing of gases, the gases being single gases such as nitrogen, helium, neon or argon.

As seen in the above description, in this embodiment a gas replacement mechanism is constituted by the supply valve 23, the exhaust valve 24, the pressure-reducing unit VP2 and the pump P6, which are connected to the reticle-gas-replacement room RI, and the main controller 100, the gas replacement mechanism replacing the gas inside the reticle-gas-replacement room RI with the specific gas in which the concentration of impurities is about the second concentration, and another gas replacement mechanism is constituted by the supply valve 47, the exhaust valve 48, the pressure-reducing unit VP1 and the pump P5, which are connected to the wafer-gas-replacement room WI, and the main controller 100, the gas replacement mechanism replacing the gas inside the wafer-gas-replacement room RI with the specific gas in which the concentration of impurities is a predetermined concentration.

As described above, according to the exposure apparatus 200 (and exposure method) of the first embodiment, during the replacement of a wafer W and a reticle R, absorbent gas in the external atmosphere can be prevented from getting into the exposure-light optical path. By this, the decrease and variation of transmittance, and the decrease of uniformity of illuminance due to the absorption of the exposure light EL can be effectively reduced even if using vacuum ultraviolet light as the exposure light EL, thereby ensuring enough exposure light power and high controllability of exposure light amount.

In addition, the time for which a reticle R stays is shorter in the reticle-gas-replacement room RI than in the reticle room 15 where the time is usually longest for exposure. Meanwhile, the concentration of impurities in the specific gas inside the reticle-gas-replacement room RI is set to be higher than that of the reticle room 15. Therefore, the supply-and-exhaust system can be made simpler, thereby lowering the cost of the system as compared with keeping the reticle-gas-replacement room RI and the reticle room 15 under the same conditions in terms of the specific gas.

In the same way, the time for which a wafer W stays is shorter in the wafer-gas-replacement room WI than in the wafer room 40 where the time is usually longest for exposure. Meanwhile, the concentration of impurities in the specific gas inside the wafer-gas-replacement room WI is set to be higher than that of the wafer room 40. Therefore, the supply-and-exhaust system can be made simpler, thereby lowering the cost of the system as compared with keeping the wafer-gas-replacement room WI and the wafer room 40 under the same conditions in terms of the specific gas.

In addition, according to this embodiment, when transferring the reticle R into the reticle room 15, the door 21 is opened and closed for the gate 18*a*, and the reticle room 15 where impurities in the specific gas are at the first concentration and the reticle-gas-replacement room RI where impurities in the specific gas are at the second concentration are connected. Therefore, the concentration of impurities in the specific gas inside the reticle room 15 rises in proportion to the time for which the door 21 is open. Because the door 21 is a high-speed shutter and can be opened and closed at high speed, the increase of the concentration of impurities in the specific gas inside the reticle room 15 can be substantially suppressed. This is also the case with transferring the reticle R from the reticle room 15.

In the same way, because the door 44 is a high-speed shutter, the increase of the concentration of impurities in the specific gas inside the wafer room 40 can be suppressed when the door 44 is open upon carrying a wafer W into and out of the wafer room 40.

It is noted that although not explicitly described in the above, the temperature is controlled in the insides of the illumination system housing 2, the reticle room 15, the barrel of the projection optical system PL, the wafer room 40, the wafer-gas-replacement room WI and the reticle-gas-replacement room RI with the same accuracy as in the environment-chamber (not shown). Moreover, although not explicitly described in the above, it is desirable that portions of the illumination system housing 2, the barrel of the projection optical system PL, the wafer-gas-replacement room WI and the reticle-gas-replacement room RI, which portions expose themselves to the specific gas (absorbent gas), should be made of a material, emitting little gas, such as stainless (SUS) as the division walls of the reticle room 15 and the wafer room 40 are. Alternatively, portions of the illumination system housing 2, the reticle room 15, the barrel of the projection optical system PL, the wafer room 40, the wafer-gas-replacement room WI and the reticle-gas-replacement room RI, which portions expose themselves to the specific gas (absorbent gas), may be coated with fluorine resin or the like, emitting little of absorbent gas such as hydro carbon.

Figure 5:
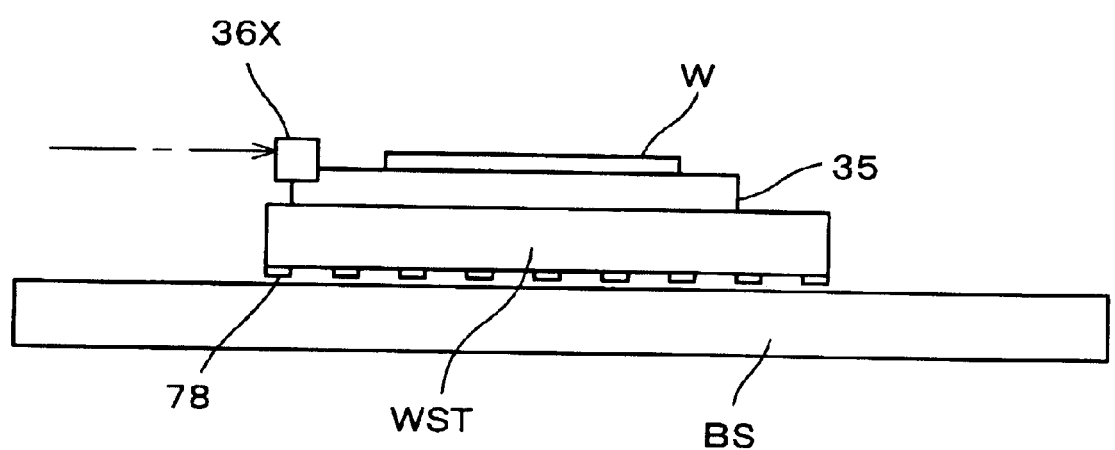
FIG. 5 is a view showing a modified example of a wafer stage.

It is remarked that although the above embodiment described the case where the wafer stage WST is of the magnetic levitation type, as shown in, e.g., FIG. 5, if using the gas levitation method where a plurality of gas-static-pressure bearings 78 are arranged on the bottom surface of a wafer stage WST to levitate the wafer stage WST by blowing pressured gas toward the upper surface of the base BS, the gas blown from the gas-static-pressure bearings 78 need be the low absorbent gas. In this case, while the gas is blown from the gas-static-pressure bearings 78 to levitate the wafer stage WST, there is no possibility of absorbent gas getting into the wafer room and affecting exposure, and by a planar motor (or linear motor) driving the wafer stage WST in non-contact and in two dimensions and at high speed, it is possible to accurately control the position thereof without being affected by the mechanical accuracy of the guide surface.

Although the above embodiment described the case where the wafer loader 43 is provided in the wafer-gas-replacement room WI and where the wafer loader 43 loads and unloads a wafer W into and from the wafer holder 35, this invention is not limited to this. That is, two conveying arms, the same as the wafer loader 43, may be arranged vertically apart from each other in the wafer-gas-replacement room WI, and one of the two conveying arms may be used only for loading a wafer while the other is used only for unloading a wafer, so that a wafer already exposed is carried from the wafer holder 35 parallel to carrying a wafer not yet exposed into the wafer holder 35. In this case, the time required for replacing a wafer can be shortened compared with the above embodiment.

Figure 6:
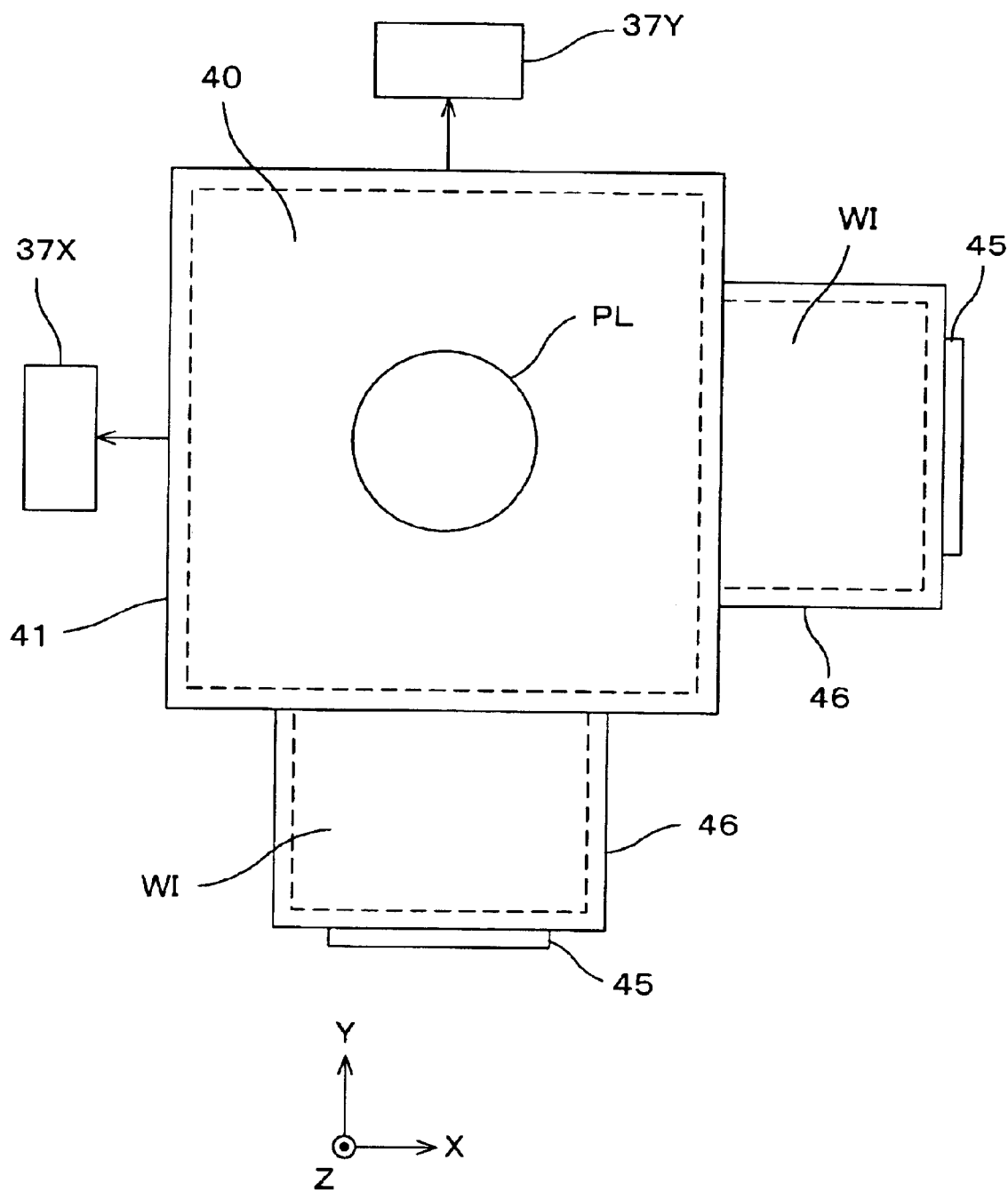
FIG. 6 is a plan view showing an example of the arrangement in which two wafer-gas-replacement rooms are arranged.

Alternatively, as shown in a schematic plan view of FIG. 6, two wafer-gas-replacement rooms WI may be provided of which one is used only for carrying in a wafer and of which the other is used only for carrying out a wafer, and the wafer-carry-out operation of (8) and (9) and the wafer-carry-in operation of (1) through (7) may be performed parallel to each other. In this case, in the wafer-gas-replacement room WI used only for carrying out, the gas replacement has to be finished before carrying out the wafer. However, because the wafer can be carried out of the wafer-gas-replacement room WI without waiting for the completion of carrying another wafer into the wafer room 40, the total wafer-replacement time from the start of carrying in a wafer from the outside to carrying another wafer out of the wafer room can be shortened as compared with even the case of using two conveying arms arranged vertically apart from each other.

Needless to say, also in the case of FIG. 6, two conveying arms may be arranged vertically apart from each other in each of the wafer-gas-replacement rooms WI so as to alternately use the wafer-gas-replacement rooms WI. Also in this case, the wafer replacement can be performed at higher speed than the above embodiment.

It is remarked that also in the transport system for a reticle R, by using the same methods as the above, i.e., arranging two conveying arms vertically apart from each other in the reticle-gas-replacement room RI or providing reticle-gas-replacement rooms RI, one of which is only for carrying in a reticle and the other of which is only for carrying out another reticle, the reticle replacement time can be shortened.

Moreover, although the above embodiment described the case where a reticle with a pellicle is used and where, by spending enough time in decreasing the pressure and charging with gas, the pellicle is prevented from being damaged, in the case of using a reticle without a pellicle as a mask, water sticking to the reticle surface can be removed by decreasing the pressure inside the reticle-gas-replacement room in the same way as in the above embodiment.

It is noted that in the case of using a reticle without a pellicle, because there is no such space GS between the reticle pattern and a pellicle PE, which space GS needs gas replacement, the gas replacement inside the reticle-gas-replacement room RI can be performed by continuously supplying and discharging the gas, that is so-called gas-flow, without need to decrease the pressure. In this case, inside the reticle-gas-replacement room RI an ultraviolet-light source 80 such as an excimer-lamp may be provided as the emitting portion of an energy beam, which source 80 is indicated by an imaginary line in FIG. 1, and which removes absorbent material, sticking to the reticle, such as water and organic substance by using ultraviolet light, i.e. so-called "light cleaning". Instead of the light source 80, the outlet of an optical fiber or relay optical system which guides light from the light source 1 or other ultraviolet-light source may be provided as the emitting portion. It is remarked that the emitting portion is not necessarily placed in the reticle-gas-replacement room RI and can be placed in any other place in the conveying path of a reticle.

Also in the wafer-gas-replacement room WI, gas replacement can be performed by the gas-flow without need to decrease the pressure. In this case, it is desirable that a wafer conveying path from a resist-coating unit (not shown) to the exposure apparatus and the space around the wafer transport system 49 be filled with gas excluding moisture and organic gas such as hydro carbon so as to prevent water and organic substances from sticking to the wafer surface.

If the gas replacement in the wafer-gas-replacement room WI or the reticle-gas-replacement room RI is performed by the gas-flow, it is desirable that the inside structure thereof be as simple as possible so as to efficiently replace gas thereof. For that purpose, it is desirable that the reticle loader 20 for transferring a reticle R from the reticle-gas-replacement room RI to the reticle room 15 be provided in the reticle room 15 and that the wafer loader 43 for transferring a wafer W from the wafer-gas-replacement room WI to the wafer room 40 be provided in the wafer room 40.

It is noted that when replacing gas by decreasing the pressure, and if the loaders 20, 43 are provided in the gas-replacement rooms RI, WI respectively, there is some possibility of lube oil vaporizing from the movable parts of the loaders 20, 43 and polluting the reticle R and the wafer W upon decreasing the pressure. Therefore, if there are some spaces in the reticle room 15 and the wafer room 40, it is preferable that the loaders are provided therein.

Although the first embodiment described that upon removing a reticle from the reticle library RL the reticle R is removed from the reticle case 27 stored in the reticle library RL and is transferred by the reticle-transport mechanism 26, the reticle-transport mechanism 26 may transfer the reticle case 27 containing the reticle R to the reticle-gas-replacement room RI.

<<A Second Embodiment>>

Next, a second embodiment of this invention will be described in the following with reference to FIG. 7, wherein a reticle contained in a reticle case is transferred as one piece. The elements that are the same as or equivalent to those of the first embodiment are represented by the same symbols, and brief or no description will be presented about them.

The second embodiment is different from the first embodiment only in the inside structure of the reticle-gas-replacement room RI and part of the reticle conveying sequence. In the following, description will be made mainly focusing on these points.

Figure 7:
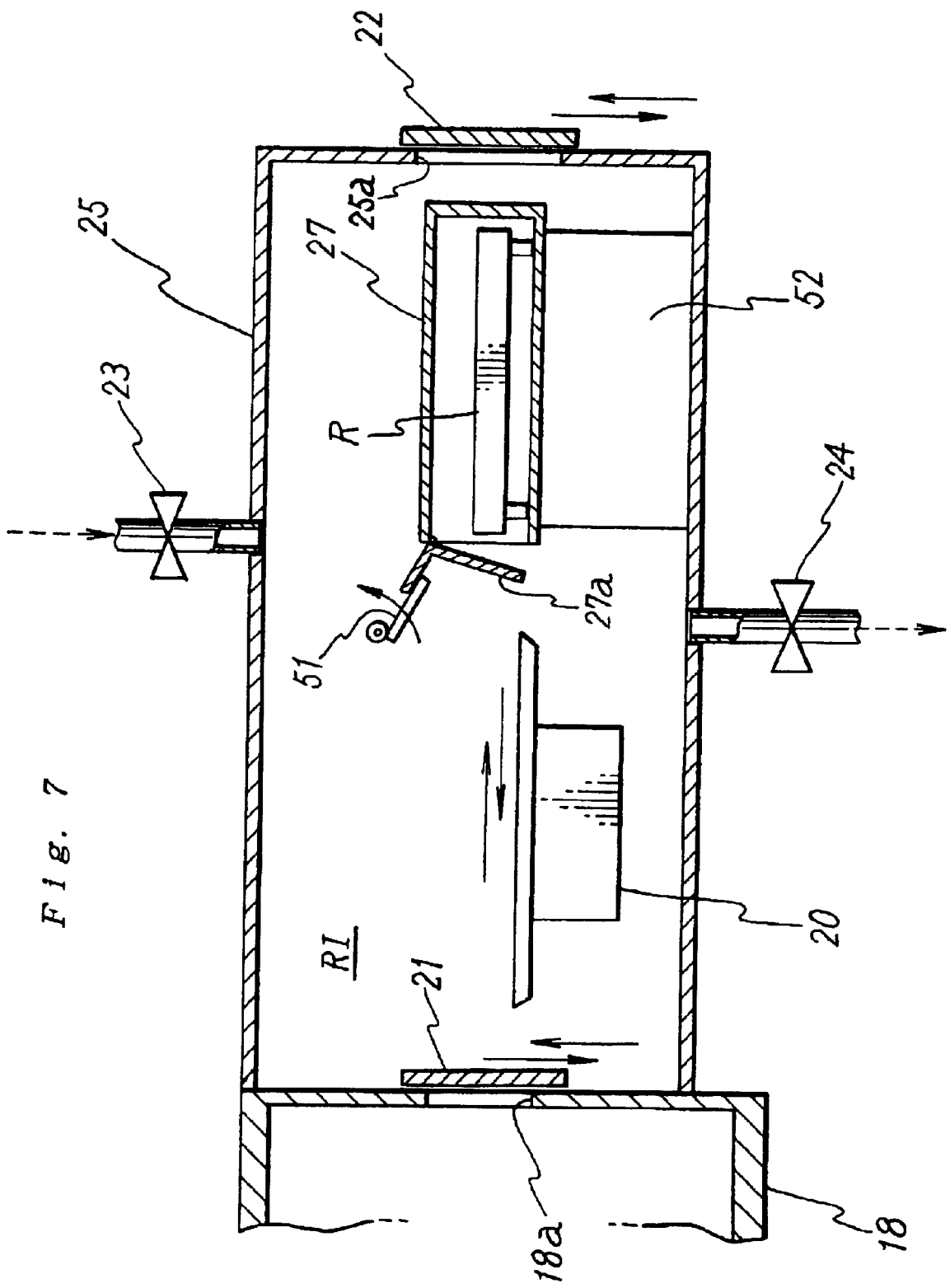
FIG. 7 is a cross-sectional view through a reticle-gas-replacement room according to a second embodiment.

FIG. 7 shows an example of the structure of the reticle-gas-replacement room RI according to the second embodiment. A reticle-case mount 52 is provided inside the reticle-gas-replacement room RI in FIG. 7. On the reticle-case mount 52, a portion fitting the outer shape of the reticle case 27 is provided that is a concavity or convexity for aligning, and the reticle case 27 is fitted and mounted at a predetermined position on the reticle-case mount 52.

In this case, the reticle case 27 is an sealed-type reticle carrier having a door 27a that can be opened and closed, and a door-open-close mechanism 51 corresponding thereto is provided inside the reticle-gas-replacement room RI. The door-open-close mechanism 51, as shown in FIG. 7, is positioned so as to be able to easily open the door 27a when the reticle case 27 is aligned by the concavity or convexity and mounted on the reticle-case mount 52.

Next, the sequence of transferring a reticle R from the reticle library RL to the reticle room 15, according to the second embodiment, will be described in the following. Although the actions of elements are performed under the control of the main controller 100 as in the first embodiment, description about the main controller 100 will be omitted to make the whole description simpler.

First, a reticle case 27 containing a reticle R is removed from any of the racks of the reticle library RL by the reticle-transport mechanism 26, and the reticle-transport mechanism 26 starts to transfer the reticle case 27 toward the reticle-gas-replacement room RI. It is remarked that the reticle case 27 is filled with the specific gas having impurities at concentration smaller than the second concentration.

And the door 22 is opened when the reticle-transport mechanism 26 holding the reticel case 27 arrives within a predetermined distance from the reticle-gas-replacement room RI. At this time the gate 18a has been closed by the door 21, which gate 18a is on the boundary between the reticle-gas-replacement room RI and the reticle room 15.

Next, the reticle-transport mechanism 26 with the reticle case 27 gets into the reticle-gas-replacement room RI through the gate 25a and mounts the reticle case 27 at the predetermined position on the reticle-case mount 52.

The reticle-transport mechanism 26 moves back through the gate 25a to the outside of the reticle-gas-replacement room RI, and the door 22 is closed. Next, the internal pressure of the reticle-gas-replacement room RI starts to decrease in the same way as in the first embodiment. Then the door-open-close mechanism 51 opens the door 27a of the reticle case 27; the pressure continues to decrease, and the decrease of the pressure ends when the pressure inside the reticle-gas-replacement room RI has dropped to, e.g., about 0.1 hPa.

By the above pressure decrease, absorbent gas, such as oxygen, and so forth are removed from inside the reticle-gas-replacement room RI.

After that, the reticle-gas-replacement room RI is filled with low absorbent gas in the same way as the above. Then the reticle loader 20 removes the reticle R from the reticle case 27; the door 21 is opened, and the reticle loader 20 transfers the reticle R into the reticle room 15 and loads it on the reticle holder 14.

Meanwhile, the reticle R is carried out in the following way.

First, the door 21 is opened, and the reticle loader 20 moves to inside the reticle room 15 through the gate 18a and unloads the reticle R from the reticle holder 14. It is remarked that until the open of the door 21 the reticle-gas-replacement room RI has been filled with the low absorbent gas having impurities at concentration smaller than the second concentration.

The reticle loader 20 with the reticle R returns to inside the reticle-gas-replacement room RI through the gate 18a, and soon after that, the door 21 is closed. Next, the reticle loader 20 returns the reticle into the reticle case 27 and moves back from inside the reticle case 27, and the door-open-close mechanism 51 closes the door 27a. After that, the inside of the reticle case 27 becomes a sealed space filled with the specific gas having impurities at concentration smaller than the second concentration. Soon after the close of the door 27a, the door 22 is opened, and the reticle-transport mechanism 26 gets into the reticle-gas-replacement room RI through the gate 25a, receives the reticle case 27 from the reticle loader 20, and moves back to outside the reticle-gas-replacement room RI through the gate 25a. After that, the door 22 is closed. Then the reticle-transport mechanism 26 returns the reticle case 27 to a predetermined rack of the reticle library RL.

The structures of the other elements are the same as those of the first embodiment.

According to the first embodiment, the same effect as that of the first embodiment can be obtained, and because the gas replacement is performed while the reticle case 27 and the retcile R are in the reticle-gas-replacement room RI, the inside of the reticle case 27 is also filled with the low absorbent gas (the specific gas), and, after being carried out, is still filled therewith. In this way, water can be prevented from sticking to the surface of a reticle in stock. That is, in this embodiment a gas replacement mechanism constituted by the supply valve 23, the exhaust valve 24, the pressure-reducing unit VP2, the pump P6, and the main controller 100 also fills the reticle case 27 with the specific gas after exposure through the reticle R. Therefore, when removing a reticle R from the reticle case 27, carrying it into the reticle room 15, and performing exposure and when, after returning the reticle R into the reticle case 27, taking out the reticle R to perform exposure again, impurities getting into the reticle room 15 can be substantially prevented. In this way, in the optical path inside the reticle room 15, the decrease and variation of transmittance of the exposure light can be suppressed that are caused by the energy absorption of the exposure light.

In the second embodiment, air-tightness inside the reticle case 27 is improved by applying sealing material such as fluorine resin to between the door 27a and the main part of the reticle case 27, and impurities such as absorbent gas can be prevented from getting therein. In addition, it is desirable that the reticle case 27 be made of fluorine resin or stainless (SUS) emitting little of absorbent gas such as hydrocarbon.

It is noted that in the second embodiment the reticle case may be a sealed-type reticle carrier such as SMIF (Standard Mechanical Interface) pod.

It is remarked that when preserving a reticle in the reticle library RL for a long time, it is preferable to circulate or continuously supply low absorbent gas through the reticle case 27.

Figure 8A:
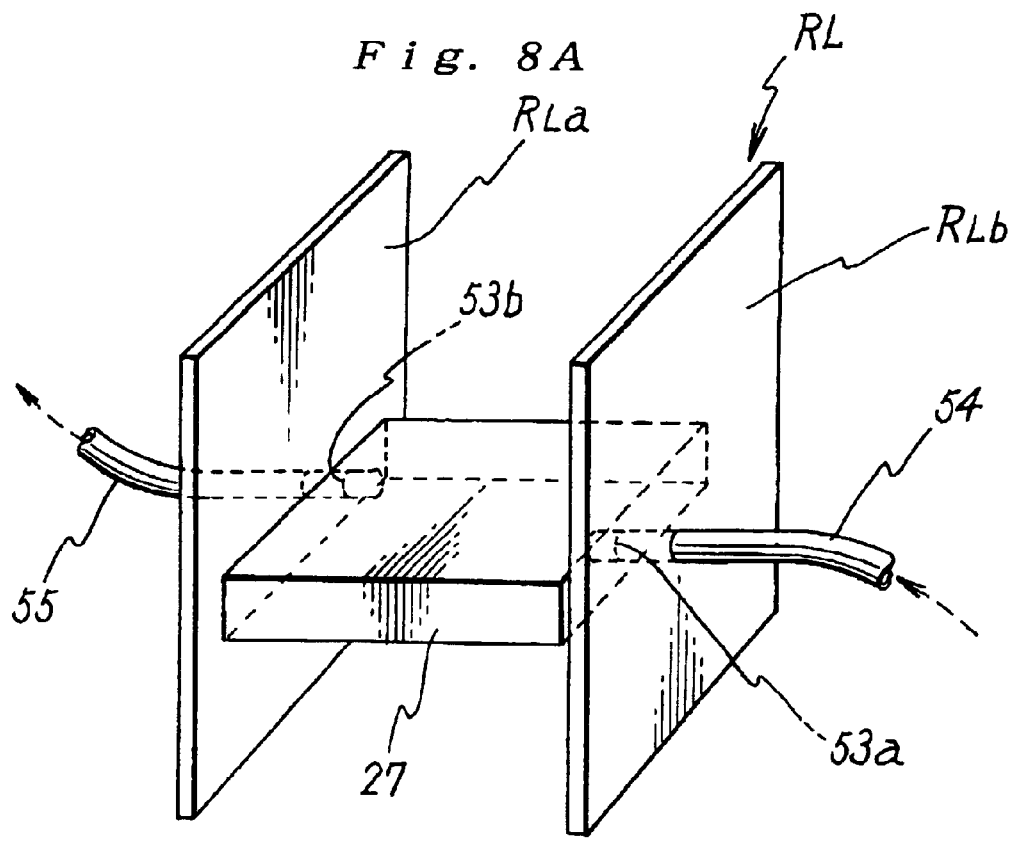
FIG. 8A is a schematic, oblique view of an exemplary reticle library for which a circulation mechanism of low-absorbent gas is provided.

FIG. 8A shows a schematic, oblique view of an exemplary reticle library having a system for circulating low absorbent gas. In FIG. 8A, a mechanism or a set of racks (not shown) for holding reticle cases is disposed between the side walls RLa, RLb of the reticle library RL, and the holding mechanism positions and holds reticle cases 27 at predetermined positions.

A reticle case 27 positioned and held in the reticle library RL is connected with a supply mechanism 54 and exhaust mechanism 55 that constitute the system for circulating low absorbent gas.

That is, joint-openings 53a, 53b are made in the right and left side walls of the reticle case 27 respectively; in portions of the side walls RLb, RLa of the reticle library RL, which portions are opposite the joint-openings 53a, 53b respectively, openings are made, and through the openings, the supply mechanism 54 and exhaust mechanism 55 are connected to the joint-openings 53a, 53b respectively.

The supply mechanism 54 and exhaust mechanism 55 are connected through a supply pipe 54C and an exhaust pipe (not shown) to one end and to another end of a supply source (not shown) of low absorbent gas respectively. An air-filter for removing particles, such as a HEPA filter or ULPA filter, and a chemical filter for removing impurities such as absorbent gas are provided in the supply and exhaust pipes, and the temperature of the absorbent gas is controlled in the supply source.

Figure 8B:
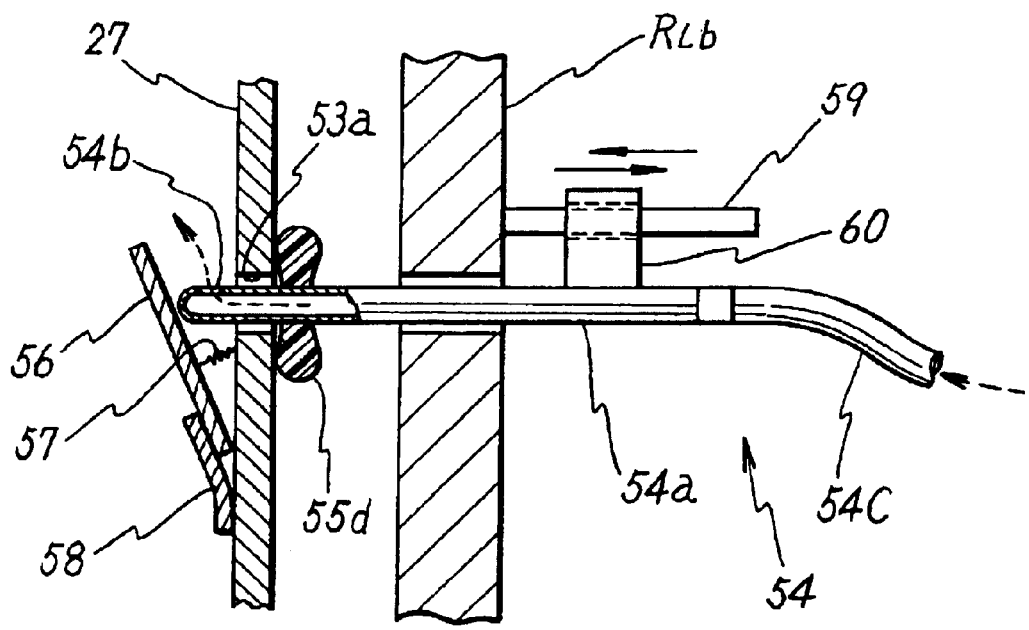
FIG. 8B is an enlarged, cross-sectional view of the joint portion of the reticle library and a supply mechanism 54 in FIG. 4A.

FIG. 8B shows an enlarged, cross-sectional view of the joint of the supply mechanism 54 in FIG. 8A. In FIG. 8B, a lid 56 is arranged on the inside wall of the reticle case 27 so as to cover the joint-opening 53a. The lid 56 is pulled toward the sidewall of the reticle case 27 by springs 57, 58 all the time. Accordingly, when no external force is exerted on the lid 56, the lid 56 is attached to the sidewall of the reticle case 27 and closes the joint-opening 53a air-tightly.

Meanwhile, on the outer surface of the reticle-library-sidewall RLb, a guide member 59 is disposed substantially perpendicular thereto, and a movable member 60 that moves back and forth along the guide member 59 is fixed on an end portion 54a of the supply mechanism 54.

Moreover, the end portion 54a of the supply mechanism 54 is inserted into the opening of the reticle-library-sidewall RLb.

Therefore, by driving the movable member 60 in the left direction in FIG. 8B, the tip of the end portion 54a is inserted into the joint-opening 53a on the sidewall of the reticle case 27. By this, the lid 56 is opened inwards, and takes the position shown in FIG. 8B. On the tip of the end portion 54a a hole 54b is made, and absorbent gas supplied through the supply pipe 54C is supplied to inside the reticle case 27 through the hole 54b. A seal member 55d is provided near the tip of the end portion 54a so as to prevent the external air from entering the reticle case 27 when the tip of the end portion 54a is inserted into the joint-opening 53a.

The joint-opening 53b and exhaust mechanism 55 have the same structure as the above.

In the case where a reticle in stock is also covered by low absorbent gas as shown by the example in FIGS. 8A, 8B, because impurities sticking to the surface of a reticle R and absorbent gas entering the space GS enclosed by the reticle pattern and the pellicle PE can be suppressed to a minimal amount. Accordingly, when carrying in a reticle, the purpose is achieved by decreasing the internal pressure of the reticle-gas-replacement replacement room RI to a value of several hPa that is relatively high. Moreover, gas inside the reticle-gas-replacement room RI may be replaced, without the decrease of the internal pressure of the reticle-gasreplacement room RI, only by gas-flow in which low absorbent gas is supplied through the supply pipe having the supply valve 23 and discharged through the exhaust pipe having the exhaust valve 24 before carrying a reticle into the reticle room 15.

It is remarked that an embodiment of the reticle library RL for which the system for circulating low absorbent gas is provided that is described above with reference to FIGS. 8A, 8B may be used singly or in the combination of the first or second embodiment.

<<A Third Embodiment>>

Next, a third embodiment of this invention will be described in the following. The elements that are the same as or equivalent to those of the first embodiment are represented by the same symbols, and brief or no description will be presented about them.

Figure 9:
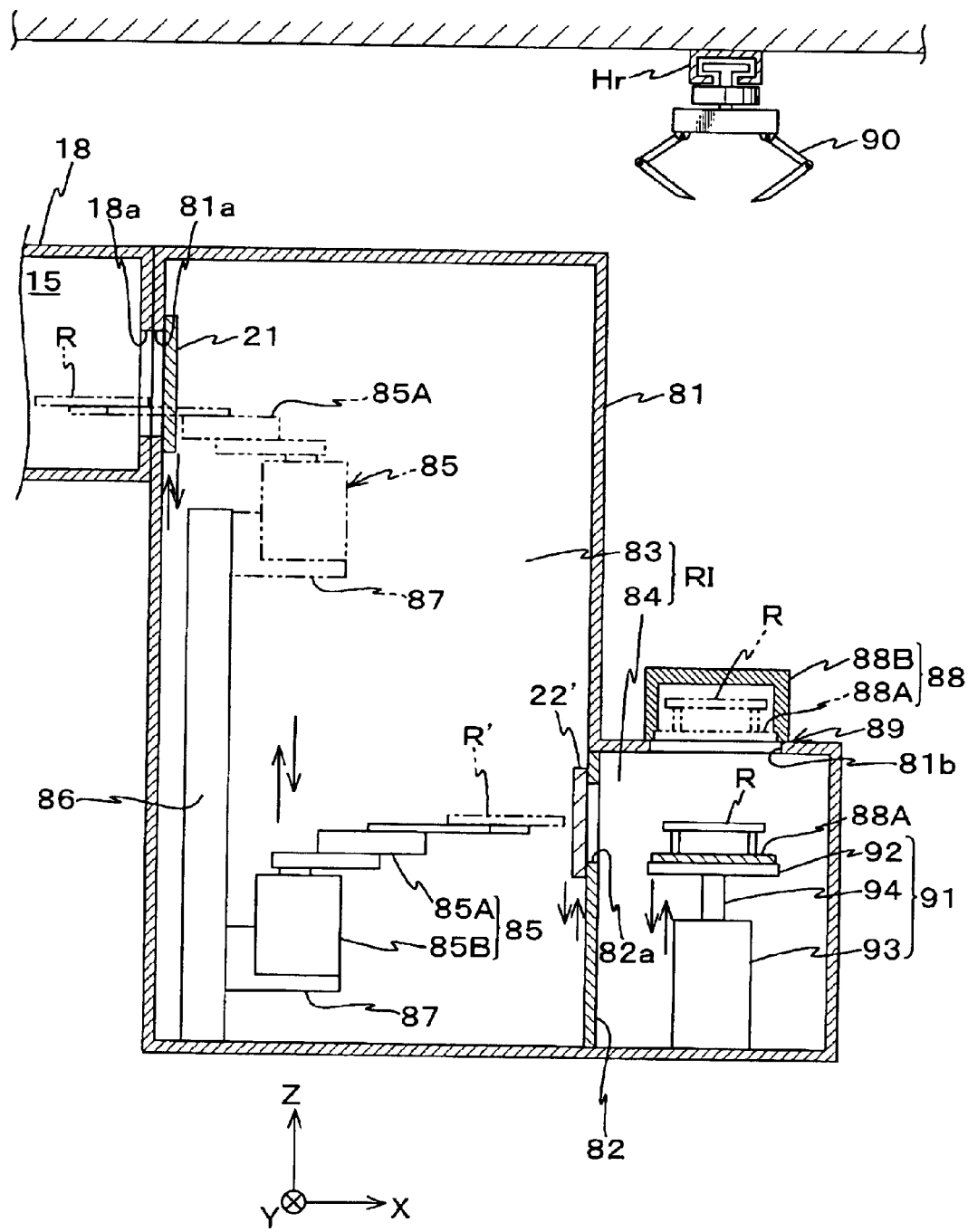
FIG. 9 is a cross-sectional view through a reserve room according to a third embodiment.

FIG. 9 shows a cross-sectional view of the schematic arrangement of a reticle-reserve room RI (referred to as a "reserve room" hereinafter) and other parts around it of an exposure apparatus according to the third embodiment.

In the third embodiment, as shown in FIG. 9, the reserve room RI is the space enclosed by a chamber 81 having a convex portion protruding in the +X direction from near the lower end thereof. This reserve room RI is divided by a division wall 82 on the boundary between the convex portion and the rest into a first room 83 adjacent, in the +X direction, to the reticle room 15 as a mask room and a second room 84 adjacent to the first room 83.

Near the end in the −X direction inside the first room 83, a horizontal multi-joint robot (scalar robot) 85 is disposed. The scalar robot 85 comprises an arm 85A that can freely extend and contract, and rotate in the X-Y plane and a driving portion 85B to drive the arm 85A. The scalar robot 85 is mounted on the upper surface of a support member 87 that moves up and down along a support guide 86 extending upwards from the floor surface near the end in the −X direction inside the first room 83. Accordingly, the arm 85A of the scalar robot 85 is able to move up and down as well as to extend and contract, and rotate in the X-Y plane. It is noted that a linear motor moves the support member 87 up and down, which motor comprises a mover (not shown) that is integrally provided in the support member 87 and a stator (not shown) extending in the Z-direction inside the support guide 86.

In the sidewall in the −X direction of the chamber 81, an opening 81a is made which is opposite the opening 18a made in the division wall 18 of the reticle room 15. In this embodiment, the division wall 18 and the chamber 81 are tightly attached together so that the external atmosphere does not enter the reticle room 15 and the first room 83 through the openings 18a, 81a. The openings 18a, 81a form a gate that the door 21 opens and closes.

In addition, an opening 82a having a predetermined height is made at a predetermined height (e.g. about 600 to 800 mm) from the floor surface in the division wall 82 constituting the sidewall in the +X direction of the first room 83. A door 22', the same as the door 22, opens and closes the opening 82a.

On the upper surface of the convex portion, constituting the second room 84, of the chamber 81, a delivery port 89 for a reticle carrier 88 as a mask container is made. On the ceiling above the delivery port 89 a guide rail Hr, along which an auto-transport system 90 that transports the reticle carrier 88 containing a reticle R moves, extends in the Y direction, the auto-transport system 90 being referred to as "OHV90" hereinafter, OHV standing for Over Head Vehicle. In this embodiment, the height of the upper surface, on which the delivery port 89 is, of the convex portion of the chamber 81 is set to be about 900 mm from the floor surface from the viewpoint of human engineering. The OHV 90 can transport the reticle carrier 88 from and to the delivery port 89, and the delivery port 89 is also suitable for an operator to carry in and out the reticle carrier 88.

As a reticle carrier 88, a SMIF (Standard Mechanical Interface) pod is used that is a sealed-type and bottom-open-type container which can contain a single reticle. Needless to say, a container may be used that can contain a plurality of reticles vertically spaced a predetermined distance apart from each other.

The reticle carrier 88, as shown in FIG. 9, comprises a carrier-main-body 88A that is a door, on the inward side of which a support member for supporting a reticle R is integrally provided; a cover 88B that is fitted on the carrier-main-body 88A from above; and a lock mechanism (not shown) that is provided on the bottom of the carrier-main-body 88A and that locks the cover 88B.

Corresponding to the structure of the reticle carrier 88, in the delivery port 89 of the chamber 81, an opening 81b is made that is slightly larger than the carrier-main-body 88A of the reticle carrier 88. This opening 81b is usually, firmly closed by an open-close member 92 that is a part of an open-close mechanism 91 which is described in the following and which is usually contained in the second room 84.

The open-close mechanism 91 comprises a driving portion 93 disposed substantially underneath the opening 81b; a driving axis 94 vertically driven by the driving portion 93; and the open-close member 92 substantially horizontally fixed on the upper end of the driving axis 94. The open-close member 92 comprises a mechanism (not shown) that fastens to the bottom surface of the carrier-main-body 88A by vacuum chuck or by mechanical connection and that unfastens a lock mechanism (not shown) provided on the carrier-main-body 88A. Hereinafter, the mechanism is referred to as a "fasten-and-unlock mechanism" for the sake of convenience.

Therefore, the open-close mechanism 91 unfastens the lock mechanism by using the fasten-and-unlock mechanism, and, after the open-close member 92 has fastened to the carrier-main-body 88A, can separate from the cover 88B the carrier-main-body 88A holding a reticle by lowering the open-close member 92 by a predetermined amount while the inside and outside of the chamber 81, thus of the reticle carrier 88, are isolated from each other. In other words, the open-close mechanism 91 can open the reticle carrier 88 while maintaining the isolation between the inside and outside of the chamber 81.

The above main controller 100 controls the open-close mechanism 91.

Although none are shown, also in the third embodiment, a supply valve, an exhaust valve, a pressure-reducing unit and a pump are connected with each of the first and second rooms 83, 84 of the reserve room RI as in the first embodiment, and the main controller 100 controls each of those elements. That is, in this embodiment a gas replacement mechanism is constituted by the supply valves, the exhaust valves, the pressure-reducing units, the pumps, which are connected with the first and second rooms 83, 84 of the reserve room RI, and the main controller 100. It is remarked that the supply valves, the exhaust valves, the pressure-reducing units and the pumps are connected to a gas-supply unit as the above.

The main controller 100 controls the supply valves, the exhaust valves, the pressure-reducing units and the pumps constituting the gas replacement mechanism such that the pressure of the specific gas atmosphere inside the first and second rooms 83, 84 of the reserve room RI is the predetermined target value as in the reticle room 15 and wafer room 40 all the time. In this case, the main controller 100 always controls the concentration of impurities (organic pollutants, water, absorbent gas such as oxygen) in the specific gas inside the reticle room 15, the first room 83 and the second room 84 such that the concentration of impurities in the specific gas inside the first room 83 is larger than that of the reticle room 15 and smaller than that of the second room 84.

For example, if the specific gas is helium, the concentration of impurities in helium inside the reticle room 15 is controlled to be smaller than the first concentration; the concentration of impurities in helium inside the first room 83 is controlled to be smaller than 10 times the first concentration, and the concentration of impurities in helium inside the second room 84 is controlled to be smaller than 100 times the first concentration. Specifically, the concentration Dc of organic pollutants in helium inside the reticle room 15 is set as Dc<1 ppb (or Dc<10 ppb); the concentration Dw of water is set as Dw<10 ppb (or Dw<100 ppb), and the concentration Dg of absorbent gas such as oxygen is set as Dg<30 ppb (or Dg<300 ppb). In this case, the concentrations Dc, Dw, Dg of organic pollutants, water and absorbent gas in helium inside the first room 83 are set as 1 ppb$\leq$Dc<10 ppb (or 10 ppb$\leq$Dc<100 ppb), 10 ppb$\leq$Dw<100 ppb (or 100 ppb$\leq$Dw<1000 ppb) and 30 ppb$\leq$Dg<300 ppb (or 300 ppb$\leq$Dg<3000 ppb) respectively. Moreover, the concentrations Dc, Dw, Dg of organic pollutants, water and absorbent gas in helium inside the second room 84 are set as 10 ppb$\leq$Dc<100 ppb (or 100 ppb$\leq$Dc<1000 ppb), 100 ppb$\leq$Dw<1000 ppb (or 1000 ppb$\leq$Dw<10000 ppb) and 300 ppb$\leq$Dg<3000 ppb (or 3000 ppb$\leq$Dg<30000 ppb) respectively.

In addition, for example, if the specific gas is nitrogen ($N_2$), upon setting the concentrations Dc, Dw, Dg of impurities in nitrogen inside each room as with the above helium, the concentration Dc of organic pollutants in nitrogen inside the reticle room 15 may be set as Dc<100 ppb; the concentration Dw of water may be set as Dw<1000 ppb, and the concentration Dg of absorbent gas such as oxygen may be set as Dg<3000 ppb. In this case, the concentrations Dc, Dw, Dg of organic pollutants, water and absorbent gas in nitrogen inside the first room 83 may be set as 100 ppb$\leq$Dc<1000 ppb, 1000 ppb$\leq$Dw<10000 ppb and 3000 ppb$\leq$Dg<30000ppb respectively. Moreover, the concentrations Dc, Dw, Dg of organic pollutants, water and absorbent gas in nitrogen inside the second room 84 may be set as 1000 ppb$\leq$Dc<10000 ppb, 10000 ppb$\leq$Dw<100000 ppb and 30000 ppb$\leq$Dg<300000 ppb respectively.

It is remarked that in the third embodiment the wafer-gas-replacement room WI is disposed in the −Y direction of the wafer room 40.

The structures, etc., of other elements are the same as those of the first embodiment.

Next, concerning an exposure apparatus according to the third embodiment, the sequence of transferring a reticle R from outside the exposure apparatus into the reticle room 15 will be described in outline.

First, according to instructions from the main controller 100, for example, the OHV 90 transports a reticle carrier 88 containing a reticle R to the delivery port 89. After confirming the reticle carrier 88 having arrived at the delivery port 89, the main controller 100 drives the driving axis 94 upwards by a predetermined amount via the driving portion 93 that is a part of the open-close mechanism 91, fastens the open-close member 92 to the carrier-main-body 88A, and unfastens the lock mechanism of the reticle carrier 88 by the fasten-and-unlock mechanism. And the main controller 100 lowers the driving axis 94 by a predetermined amount via the driving portion 93. As one piece with the driving axis 94, the open-close member 92 fastened to the carrier-main-body 88A moves down by the predetermined amount, and the reticle carrier 88 is opened while maintaining the isolation between the inside and outside of the chamber 81. That is, the carrier-main-body 88A holding a reticle R is separated from the cover 88B. FIG. 9 shows the state where the carrier-main-body 88A is separated from the cover 88B with the door 22' being closed.

Next, the main controller 100 opens the door 22', makes the arm 85A enter the second room 84 through the opening 82a, using the driving portion 85B of the scalar robot 85, and inserts it below the reticle R supported by the open-close member 92. Then the main controller 100 slightly lifts the scalar robot 85 by a linear motor (not shown) so that the arm 85A supports the reticle R from below.

Next, the main controller 100 contracts the arm 85A using the driving portion 85B, transports the reticle R into the first room 83 through the opening 82a, and close s the door 22'. An imaginary line in FIG. 9 to which a symbol R' is attached represents the reticle R that has just been transported into the first room.

As described above, because when the reticle R is transported into the first room 83, the first room 83 and the second room 84 are connected, the concentration of impurities in the specific gas of the first room 83 increases slightly. However, because the inside of the chamber 81 is isolated from the outside (external atmosphere), and the first and second rooms 83, 84 are filled with the specific gas although the concentrations are different, and furthermore the time of the door 22' being open is short, almost no impact is caused. After that, the main controller 100 restores the specific gas environment inside the first room 83 via the gas replacement mechanism.

Then the main controller 100 lifts the scalar robot 85 by a linear motor (not shown) up to a position indicated by an imaginary line in FIG. 9.

After that, the main controller 100 opens the door 21, rotates and stretches the arm 85A so as to make the arm 85A holding the reticle R enter the reticle room 15 through the opening 81a, 18a, and loads the reticle R onto the reticle holder 14. An imaginary line in FIG. 9 represents the arm 85A that are just about to load the reticle R onto the reticle holder 14.

After the completion of loading the reticle R onto the reticle holder 14, the main controller 100 contracts and returns the arm 85A to the first room 83 through the opening 81a, 18a and closes the door 21.

As described above, because when the reticle R is loaded onto the reticle holder 14, the reticle room 15 and the first room 83 are connected, the concentration of impurities in the specific gas of the reticle room 15 increases slightly. However, because the reticle room 15 and the first room 83 are filled with the specific gas although the concentrations are different, and the time of the door 22' being open is short, almost no impact is caused. After that, the main controller 100 restores the specific gas environment inside the reticle room 15 via the gas replacement mechanism (the supply valve 16, the exhaust valve 17, the pump P2, etc.).

Meanwhile, after exposure through the reticle on the reticle holder 14, the main controller 100 controls the scalar robot 85, the doors 21, 22', and the like and transports the reticle R to a position above the carrier-main-body 88A underneath the delivery port 89 in a sequence reverse to the above sequence. The main controller 100 fits the carrier-main-body 88A to the cover 88B in a sequence reverse to the above sequence, using the open-close mechanism 91, and the reticle carrier 88 stands by for transport by OHV 90.

As seen in the above description, in the third embodiment the robot 85, the support member 87 and the linear motor (not shown) that drives the support member 87 up and down constitute the mask transport system.

As described above, according to an exposure apparatus of the third embodiment, a plurality of sealed rooms that temporarily contain a reticle R for exposure, i.e. the reticle room 15, the reserve room RI (the first and second rooms 83, 84), are filled with the specific gases each having a different concentration of impurities. Therefore, the reticle is under the specific gas environment before and after the reticle is in the reticle room 15 for exposure, as well. Accordingly, impurities can be substantially prevented from getting into the optical path inside the reticle room 15 when the reticle is carried into the reticle room 15. In this way, in the optical path inside the reticle room 15, the decrease and variation of transmittance of the exposure light and the decrease of uniformity of illuminance can be suppressed that are caused by the energy absorption of the exposure light, thereby ensuring stable and enough exposure light power. In this case, because each room 15, RI is filled with the specific gas having a different concentration of impurities, and the impurity-concentration of the specific gas inside the reserve room RI is set to be higher than that of the reticle room 15, the equipment becomes simpler and less expensive than in the case of setting the specific gas environment of the reserve room RI to be equivalent to that of the reticle room 15, the time for which a reticle stays in the reserve room RI being shorter than that in the reticle room 15.

In addition, on the second room 84 of the chamber 81 constituting the reserve room RI for a reticle, the delivery port 89 is provided into and from which the reticle carrier 88 is loaded and unloaded. In this case, a mask store portion for storing a reticle R as a mask is constituted by the reticle carrier 88 which has been carried to the delivery port 89 on the reserve room RI (more specifically the second room 84). Inside the second room 84, the open-close mechanism 91 is arranged which opens and closes the carrier-main-body 88A of the reticle carrier 88, isolating the inside of the room from the outside. Therefore, the reticle carrier 88 containing a reticle R can be opened while the reticle carrier 88 is on the delivery port 89 and the open-close mechanism 91 is isolating the inside of the reserve room RI from the outside. Accordingly, impurities such as absorbent gas and organic pollutants can be prevented from entering the reserve room RI and sticking to the reticle when the reticle is removed from the reticle carrier 88.

Moreover, in the third embodiment the reserve room RI is divided by the division wall 82 having a door that can be opened and closed into the first room 83 adjacent to the reticle room 15 and the second room 84 in which the open-close mechanism 91 is arranged. The impurity-concentrations of the specific gas inside the first and second rooms 83, 84 are set as that of the first room 83 is higher than or equal to that of the reserve room RI, i.e. the first concentration, and is lower than that of the second room 84. That is, the impurity-concentrations of the specific gas inside the first and second rooms 83, 84 are set such that the impurity-concentrations of the specific gas inside the second room 84 is highest, the second room 84 being further away from the reticle room 15. In this way, because the impurity-concentrations of the specific gas inside the first and second rooms 83, 84 can be efficiently and easily set to desired values, and that of the first room 83 closer to the reticle room 15 is lower than that of the second room 84, impurities can be substantially prevented from getting into the optical path inside the reticle room 15 along with the reticle when the reticle is carried into the reticle room 15.

In addition, because in the reserve room RI for a reticle, reticle-transport systems (85, 87, etc.) as mask transport systems are arranged that transport a reticle from and to the reticle room 15, no reticle-transport system needs to be provided in the reticle room 15, thereby being able to reduce the size of the reticle room 15. That is, because the reticle room 15 of which the impurity-concentration of the specific gas has to be lowest and of which the equipment cost is likely to be highest can be reduced in size, the equipment for setting the specific gas environment of the reticle room 15 becomes simpler according to the reduction of the size, and the equipment cost can be reduced.

It is noted that although the third embodiment described the case where a SMIF pod for containing a reticle R is employed as a reticle carrier constituting the mask store portion, not being limited to that, a SMIF pod for containing a plurality of reticles R or a reticle carrier (mask container) of a FOUP type may be employed. In this case, a plurality of reticles (masks) are stored in the mask container as the mask store portion, and the reticle-transport systems (85, 87, etc.) transport reticles between the reticle carrier and the reticle room 15. Therefore, the time for transporting reticles can be shortened compared with transporting reticles one by one from the outside and the third embodiment as well.

It is noted that although the third embodiment described the case where the reserve room RI is divided into the first room 83 and the second room 84, not being limited to that, the reserve room RI may be divided by division walls each having a door that can be opened and closed into more than two rooms including the first room adjacent to the mask room and the second room in which the open-close mechanism is arranged. In this case, the impurity-concentrations of the specific gas inside the rooms may be set as that of the first room is higher than the first concentration, and is lower than that of the second room. Alternatively, the impurity-concentrations of the specific gas inside the rooms may be set such that the impurity-concentrations of the specific gas decreases as going from the second room to the first room. In such cases, the effect equivalent to the third embodiment can also be obtained.

Furthermore, in the third embodiment a pre-alignment portion for a reticle R may be provided in the reserve room RI (specifically the first room 83 or second room 84). In addition, if a reticle carrier transported to the delivery port 89 can contain a plurality of reticles, a rack for temporarily storing a plurality of reticles may be provided in the reserve room RI, particularly in a position inside the first room 83 and near the reticle room 15 so that the plurality of reticles from the reticle carrier can be stored in the rack, the reticles being to be used by the exposure apparatus. In this case, the time for replacing a reticle can be shortened.

It is remarked that although the first to third embodiments described the case where the reticle-gas-replacement room (or the reserve room) RI and the wafer-gas-replacement room WI are provided, both of them need not be provided. Because if the reticle room is smaller in size than the wafer room, the decrease of pressure and gas charge after carrying in a reticle, described above, do not take much time, the replacement of the gas inside the reticle room may be performed after the carrying-in of a reticle, and in such case, the reticle-gas-replacement room is not needed. Obviously, if the decrease of pressure and gas charge in the wafer room are performed after carrying a wafer into the wafer room, the wafer-gas-replacement room is not needed.

In addition, although each of the above embodiments described the case where a loader (transport system) is provided in each of the reticle-gas-replacement room and the wafer-gas-replacement room, not being limited to that, a loader may be provided in each of the wafer room and the reticle room. In this case, a loader need not be provided in the reticle-gas-replacement room and the wafer-gas-replacement room. Furthermore, a reticle library can be arranged in the reticle room 15, or a wafer container such as FOUP (Front Opening Unified Pod) or OC (Open Carrier) can be arranged in the wafer room. In these cases, the throughput can be improved because the time for replacing a reticle or the time for replacing a wafer is shorter.

In addition, although each of the above embodiments described the case where the gas environments of the reticle room 15 and the wafer room 40 are the same, in the wafer room 40, for example, low-absorbent gas may be made to flow only along the surface of a wafer W. In this case, it is desirable that discharge by vacuum and supply of low-absorbent gas be performed simultaneously. In this case, the influence that the droplets of resist coating the wafer have on exposure can be reduced.

It is noted that although in the first to third embodiments the impurity-concentrations are different between the reticle room 15 or the wafer room 40 and the reserve room thereof, if the reserve room is divided into a plurality of sub-rooms, the impurity-concentration of at least one of the sub-rooms has to be different from, specifically higher than, that of the reticle room 15 or the wafer room 40. It is remarked that when the impurity-concentration of a sub-room connected with the reticle room 15 or the wafer room 40 is set to be higher, the impurity-concentrations of other sub-rooms that are located in the upper stream of the transport path for reticles or wafers should be equal to or higher than that of the sub-room.

In addition, when the impurity-concentration of a sub-room is set to be higher than that of the reticle room 15, the wafer room 40, or other sub-rooms, downstream of the sub-room in the transport path for reticles or wafers, the pressure inside the reticle room 15, the wafer room 40, or the sub-rooms may be set higher so that the gas of the sub-room having a higher concentration of impurities does not flow into the reticle room 15, the wafer room 40, or the sub-rooms, where the impurity-concentrations are lower.

Moreover, when retrieving and using specific gas such as helium again, after having removed impurities contained in the retrieved, specific gas by a chemical filter and the like so that the concentration of impurities decreases to less than the setting value, the specific gas may be supplied to the reticle room 15, the wafer room 40 and the reserve rooms. Alternatively, the specific gas alone, or mixed with fresh specific gas, may be supplied to the reserve rooms and/or the reticle carrier while fresh specific gas is supplied to the reticle room 15 and the wafer room 40. In these cases, it is possible to reduce the cost of the specific gas and control the impurity-concentrations of the reticle room 15, the wafer room 40 and the reserve rooms so as to be lower than respective target values.

Although in each of the above embodiments, the present invention is applied to a reduction projection exposure apparatus of the step-and-repeat type, the application of the present invention is not limited to that. That is, the present invention can be suitably applied to a scanning exposure apparatus of a step-and-scan type or the like. In this case, a reticle holder 14 is arranged on a reticle stage (not shown) such that a reticle R can be scanned in one or more dimensions, and the wafer stage WST is scanned synchronously with the scanning of the reticle stage. In this case, an interferometer for reticles may have the same structure as the above interferometer 37X and the like.

Additionally, it is preferable that the scanning stage for a reticle is a stage using levitation by gas flow, and the gas for levitating the stage should be the low-absorbent gas as described above.

It is noted that although in each of the above embodiments, $F_2$ laser of oscillation wavelength 157 nm, $Kr_2$ laser of oscillation wavelength 146 nm, $Ar_2$ laser of oscillation wavelength 126 nm or an ArF excimer laser of oscillation wavelength 193 nm is used as the light source of an exposure apparatus, the present invention is not limited to that. As a vacuum ultraviolet light other than the above laser lights, for example, a higher harmonic wave may be used which is obtained with wavelength conversion into ultraviolet by using non-linear optical crystal after having amplified a single wavelength laser light, infrared or visible, emitted from a DFB semiconductor laser device or a fiber laser by a fiber amplifier having, for example, erbium (or erbium and ytterbium) doped.

For example, considering that the oscillation wavelength of a single wavelength laser is in the range of 1.51 to 1.59 um, an eight-time-higher harmonic wave of which the wavelength is in the range of 189 to 199 nm or a ten-time-higher harmonic wave of which the wavelength is in the range of 151 to 159 nm is emitted. Especially, when the oscillation wavelength is in the range of 1.544 to 1.553 um, an eight-time-higher harmonic wave of which the wavelength is in the range of 193 to 194 nm, that is, almost the same as ArF excimer laser light (ultraviolet light) is obtained, and when the oscillation wavelength is in the range of 1.57 to 1.58 um, a ten-time-higher harmonic wave of which the wavelength is in the range of 157 to 158 nm, that is, almost the same as $F_2$ laser light (ultraviolet light) is obtained.

Furthermore, when the oscillation wavelength is in the range of 1.03 to 1.12 um, a seven-time-higher harmonic wave of which the wavelength is in the range of 147 to 160 nm is emitted, and, especially, when the oscillation wavelength is in the range of 1.099 to 1.106 um, a seven-time-higher harmonic wave of which the wavelength is in the range of 157 to 158 nm, that is, almost the same as $F_2$ laser light (ultraviolet light) is obtained. In this case, for example, ytterbium-doped fiber laser can be employed as the single wavelength laser.

Moreover, the scale of the projection optical system is not limited to a reduced scale and may be an equal or magnified scale. Furthermore, for refraction optical elements of the projection optical system, quartz or fluorite can be used as the glass material when an ArF excimer laser is employed, and only fluorite can be used as the glass material when light having a wavelength shorter than $F_2$ laser is employed.

Additionally, in an exposure apparatus of this invention, not being limited to a refraction optical system, a reflection system composed of only reflection optical elements or a reflection-refraction system (catadioptric system) having reflection optical elements and refraction optical elements may be used as the projection optical system. As a reflection-refraction type of projection optical system, a reflection-refraction system having a beam-splitter and concave mirror as reflection optical elements, which system is disclosed in, for example, Japanese Patent Laid-Open No. 8-171054 and U.S. Pat. No. 5,668,672 corresponding thereto, and Japanese Patent Laid-Open No. 10-20195 and U.S. Pat. No. 5,835,275 corresponding thereto, or a reflection-refraction system not having a beam-splitter but having a concave mirror, etc., as reflection optical elements, which system is disclosed in, for example, Japanese Patent Laid-Open No. 8-334695 and U.S. Pat. No. 5,689,377 corresponding thereto, and Japanese Patent Laid-Open No. 10-3039 and U.S. patent application Ser. No. 873,605 corresponding thereto (application date: Jun. 12, 1997), may be used. The disclosures in the above Japanese Patent Laid-Opens, U.S. Patents and U.S. Patent Application are incorporated herein by reference as long as the national laws in designated states or elected states, to which this international application is applied, permit.

And as a reflection-refraction type of projection optical system, a reflection-refraction system, disclosed in U.S. Pat. Nos. 5,031,976, 5,488,229 and 5,717,518 in which a plurality of refraction optical elements and two mirrors (a concave mirror as a main mirror and a back surface mirror which is a refraction optical element or plane parallel plate having a reflection surface formed on the opposite side to the incident surface thereof and which serves as a sub-mirror) are disposed along one axis and in which the intermediate image of a reticle pattern, which image is formed by the plurality of refraction optical elements, is imaged on a wafer with the main and sub mirrors may be used. In this reflection-refraction system, the main and sub mirrors are arranged following the plurality of refraction optical elements; illumination light passes through part of the main mirror, is reflected by the sub-mirror and the main mirror in turn, passes through part of the sub-mirror and reaches the wafer. The disclosures in the above U.S. Patents are incorporated herein by reference as long as the national laws in designated states or elected states, to which this international application is applied, permit.

Needless to say, the present invention can be applied not only to a wafer exposure apparatus used in the manufacture of semiconductor devices but also to an exposure apparatus that transfers a device pattern onto a glass plate and that is used in the manufacture of displays such as liquid crystal display devices, an exposure apparatus that transfers a device pattern onto a ceramic plate and that is used in the manufacture of thin magnetic heads, and an exposure apparatus used in the manufacture of pick-up devices (CCD, etc.) or micro-machines.

Moreover, the present invention can be applied not only to an exposure apparatus for producing micro devices such as semiconductor devices but also to an exposure apparatus that transfers a circuit pattern onto a glass substrate or silicon wafer so as to produce reticles or masks used by a light exposure apparatus, EUV (Extreme Ultraviolet) exposure apparatus, X-ray exposure apparatus, electron beam exposure apparatus, etc. Incidentally, in an exposure apparatus using DUV (far ultraviolet) light or VUV (vacuum ultraviolet) light, a transmission-type reticle is employed in general. And as the substrate of the reticle, quartz glass, quartz glass with fluorine doped, fluorite, magnesium fluoride, or quartz crystal is employed. And an X-ray exposure apparatus of a proximity method or electron beam exposure apparatus employs a transmission-type mask (stencil-mask, membrane-mask), and as the substrate of the mask, silicon wafer or the like is employed.

An exposure apparatus according to this invention such as the exposure apparatus 200 can be made in the following manner. The illumination optical system and the projection optical system, which are composed of a plurality of lenses, are built in the housing of the exposure apparatus, and optical adjustment is performed thereto; the wafer stage (if of the scan type, the reticle stage as well) that consists of a number of mechanical parts is installed in the exposure apparatus housing and is connected with electric wires and pipes; the reticle room 15, the wafer room 40, the reticle-gas-replacement room (the reserve room) and the wafer-gas-replacement room are built into the exposure apparatus housing and are connected with gas pipes, and the control system including the main controller 100 is connected to the above components, and then overall adjustment (electrical adjustment, operation check and the like) is performed. Incidentally, it is preferable that the exposure apparatus is made in a clean room where temperature, cleanness and the like are controlled.

<<A Device Manufacturing Method>>

Next, an embodiment of the method of manufacturing devices using a lithography system and exposure apparatus thereof according to the above embodiments will be described.

Figure 10:
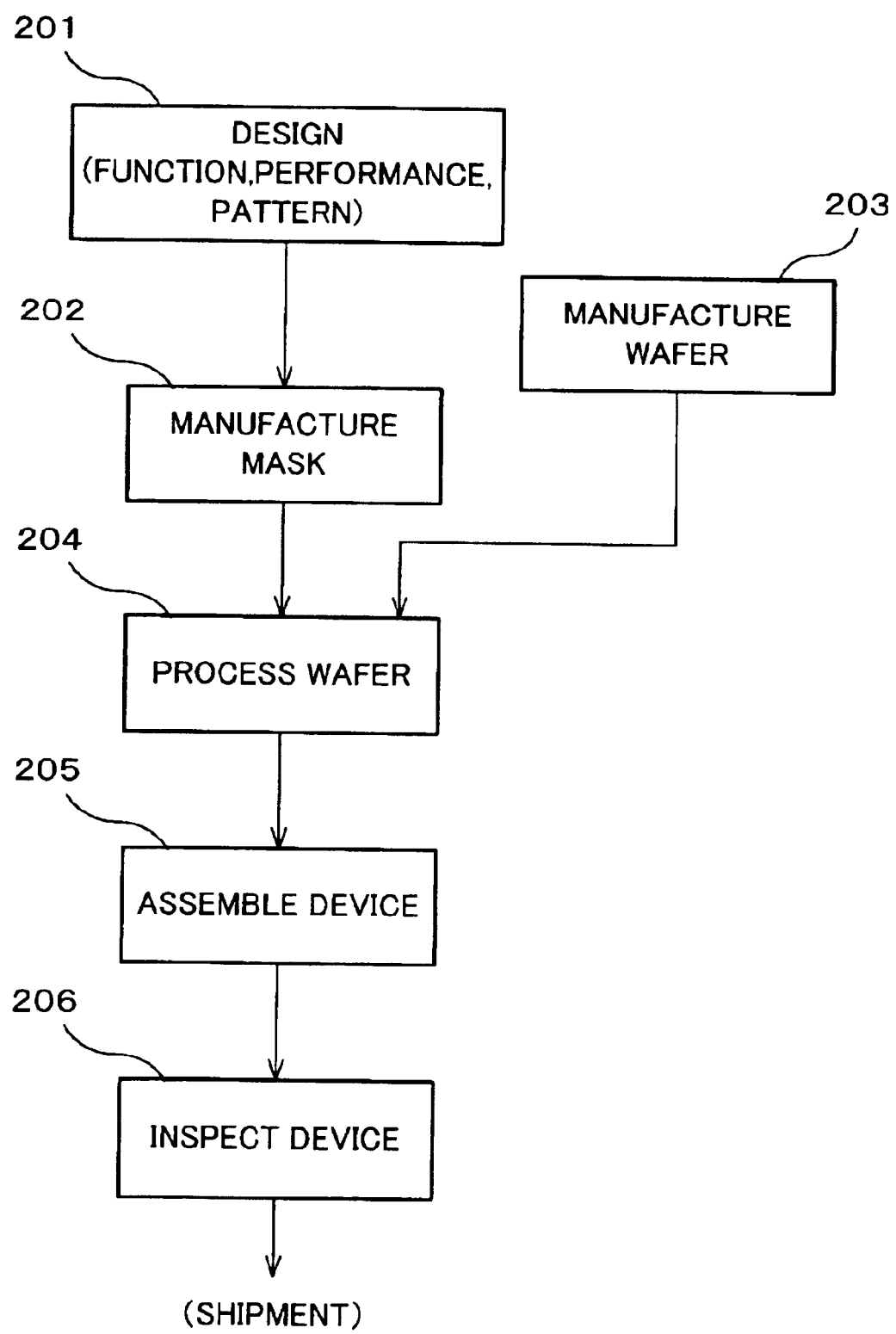
FIG. 10 is a flow chart for explaining a device manufacturing method according to this invention.

FIG. 10 is a flow chart for the manufacture of devices (semiconductor chips such as IC or LSI, liquid crystal panels, CCD's, thin magnetic heads, micro machines, or the like) in this embodiment. As shown in FIG. 10, in step 201 (design step), function/performance design for the devices (e.g., circuit design for semiconductor devices) is performed and pattern design is performed to implement the function. In step 202 (mask manufacturing step), masks on which a different sub-pattern of the designed circuit is formed are produced. In step 203 (wafer manufacturing step), wafers are manufactured by using silicon material or the like.

In step 204 (wafer processing step), actual circuits and the like are formed on the wafers by lithography or the like using the masks and the wafers prepared in steps 201 through 203, as will be described later. In step 205 (device assembly step), the devices are assembled from the wafers processed in step 204. Step 205 includes processes such as dicing, bonding, and packaging (chip encapsulation).

Finally, in step 206 (inspection step), a test on the operation of each of the devices, durability test, and the like are performed. After these steps, the process ends and the devices are shipped out.

Figure 11:
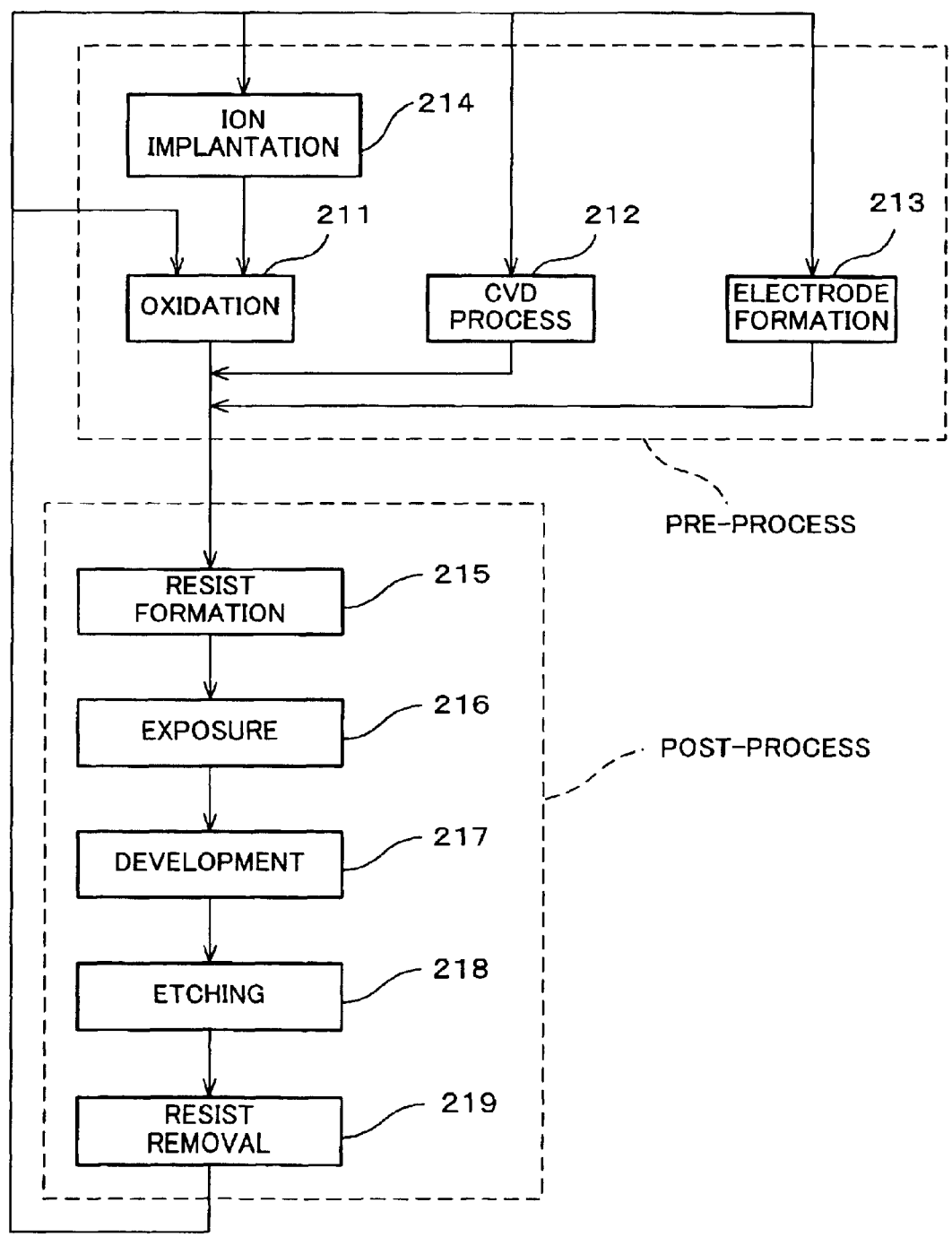
FIG. 11 is a flow chart showing a process of step 204 of FIG. 10.

FIG. 11 is a flow chart showing a detailed example of step 204 described above in manufacturing semiconductor devices. Referring to FIG. 11, in step 211 (oxidation step), the surface of a wafer is oxidized. In step 212 (CVD step), an insulating film is formed on the wafer surface. In step 213 (electrode formation step), electrodes are formed on the wafer by vapor deposition. In step 214 (ion implantation step), ions are implanted into the wafer. Steps 211 through 214 described above constitute a pre-process for each step in the wafer process and are selectively executed in accordance with the processing required in each step.

When the above pre-process is completed in each step in the wafer process, a post-process is executed as follows. In this post-process, first of all, in step 215 (resist formation step), the wafer is coated with a photosensitive material (resist). In step 216, the above exposure apparatus transfers a sub-pattern of the circuit on a mask onto the wafer according to the above method. In step 217 (development step), the exposed wafer is developed. In step 218 (etching step), an exposing member on portions other than portions on which the resist is left is removed by etching. In step 219 (resist removing step), the unnecessary resist after the etching is removed.

By repeatedly performing these pre-process and post-process, a multiple-layer circuit pattern is formed on each shot-area of the wafer.

According to the device manufacturing method of this embodiment described above, in the exposure step (step 216), an exposure apparatus and exposure method according to any of the above embodiments is used, and it is possible to improve resolving power by using exposure light in a vacuum ultraviolet light range and to accurately control exposure amount. Accordingly, highly-integrated devices having a minimum line width of about 0.1 um can be manufactured with high yield.

INDUSTRIAL APPLICABILITY

As described above, an exposure apparatus and exposure method according to this invention is suitable to accurately form fine patterns on a substrate such as a wafer in the lithography process of manufacturing micro-devices such as integrated circuits. In addition, a device manufacturing method according to this invention is suitable to manufacture devices having a fine pattern.

What is claimed is:

1. An exposure apparatus that transfers a pattern of a mask onto a substrate by irradiating said mask with exposure light, the exposure apparatus comprising:
   a sealed mask room that covers at least an optical path near said mask of the optical path of said mask to said substrate and that is filled with gas having a characteristic of absorbing little of said exposure light;
   a sealed mask-reserve room, which temporarily contains said mask before being carried into said mask room, with at least one door through which said mask is transported;
   a gas-replacement system connected to said mask-reserve room that supplies a specific gas to said mask-reserve room; and
   a mask cleaning system that removes materials having absorption for exposure light and existing around said mask in said mask-reserve room.

2. An exposure apparatus according to claim 1, further comprising:
   a mask-transport system that transports said mask from said mask-reserve room through said door to said mask room.

3. An exposure apparatus according to claim 1, wherein said mask cleaning system includes an energy-beam-emitting portion that irradiates said mask with an energy beam in an ultraviolet range, and said energy beam enters said mask-reserve room.

4. An exposure apparatus according to claim 3, wherein a beam source of said energy-beam-emitting portion is an excimer lamp.

5. An exposure apparatus according to claim 3, wherein said gas-replacement system replaces gas existing in said mask-reserve room with said specific gas by making said specific gas flow continuously.

6. An exposure apparatus according to claim 3, wherein said gas-replacement system includes a pressure-reduction mechanism that is connected to said mask-reserve room and reduces pressure in said mask-reserve room.

7. An exposure apparatus according to claim 1, wherein said exposure light is light having a wavelength not longer than 200 nm.

8. An exposure apparatus according to claim 1, wherein said specific gas is substantially composed of gases selected from the group consisting of: nitrogen, argon, helium, neon and krypton.

9. An exposure apparatus according to claim 1, further comprising:
   a substrate room constituted by a sealed room that covers at least an optical path near a substrate of the optical path of said exposure light from said mask to said substrate and that is filled with said specific gas.

10. An exposure apparatus according to claim 9, further comprising:
    a substrate-reserve room constituted by a sealed room that is arranged adjacent to said substrate room and that temporarily stores said substrate before being carried into said substrate room; and
    a gas-replacement mechanism connected to said substrate-reserve room that replaces gas in said substrate-reserve room with said specific gas.

11. An exposure apparatus that transfers a pattern of a mask onto a substrate by irradiating said mask with exposure light, the exposure apparatus comprising:
    a sealed mask room that covers at least an optical path near said mask of the optical path of said mask to said substrate and that is filled with gas having a characteristic of absorbing little of said exposure light;
    a sealed mask-reserve room, which temporarily contains said mask before being carried into said mask room, with at least one door through which said mask is transported;
    a gas-replacement system connected to said mask-reserve room that supplies a specific gas to said mask-reserve room; and
    a removing system connected to said mask-reserve room that removes materials having absorption for exposure light and existing around said mask.

12. An exposure apparatus according to claim 11, further comprising:
    a mask-transport system that transports said mask from said mask-reserve room through said door to said mask room.

13. An exposure apparatus according to claim 11, further comprising:
    a gas-replacement mechanism in said sealed mask-reserve room that replaces gas existing in a space between said mask and a pellicle disposed in a vicinity of said mask with said specific gas, wherein
    said gas-replacement mechanism replaces said gas through gas vents on a pellicle-frame disposed in between said mask and said pellicle.

14. An exposure apparatus according to claim 13, wherein said gas-replacement mechanism spends a time of not less than 10 seconds in performing said gas replacement.

15. An exposure apparatus according to claim 13, wherein said removing system includes a pressure-reduction mechanism that reduces pressure in said mask-reserve room.

16. An exposure apparatus according to claim 11, wherein
    in a chamber constituting said mask-reserve room, a delivery port is provided into and from which a sealed-type mask container containing said mask and having a door that can be opened and closed is loaded and unloaded, and
    in said mask-reserve room, an open-close mechanism is provided that opens and closes the door of said mask container to isolate the inside of said mask-reserve room from the outside.

17. An exposure apparatus according to claim 16, wherein said mask container is a bottom-open-type mask container on the bottom of which said door is provided.

18. An exposure apparatus according to claim 11, wherein said exposure light is light having a wavelength not longer than 200 nm.

19. An exposure apparatus according to claim 11, wherein said specific gas is substantially composed of gases selected from the group consisting of: nitrogen, argon, helium, neon and krypton.

20. An exposure apparatus according to claim 11, further comprising:
a substrate room constituted by a sealed room that covers at least an optical path near a substrate of the optical path of said exposure light from said mask to said substrate and that is filled with said specific gas.

21. An exposure apparatus according to claim 20, further comprising:
a substrate-reserve room constituted by a sealed room that is arranged adjacent to said substrate room and that temporarily stores said substrate before being carried into said substrate room; and
a gas-replacement mechanism connected to said substrate-reserve room that replaces gas in said substrate-reserve room with said specific gas.

22. An exposure apparatus according to claim 11, wherein said removing system includes a pressure-reduction mechanism that is connected to said mask-reserve room and reduces pressure in said mask-reserve room.

23. An exposure apparatus according to claim 11, wherein said removing system includes an energy-beam-emitting portion that irradiates said mask with an energy beam in an ultraviolet range, and
said energy beam reaches inside said mask-reserve room.

24. An exposure apparatus according to claim 23, wherein a source of said energy-beam-emitting portion is an excimer lamp.

25. An exposure method that transfers a pattern of a mask onto a substrate by irradiating said mask with exposure light, the exposure method comprising:
filling a sealed space that covers at least an optical path near said mask of the optical path of said exposure light from said mask to said substrate with gas having a characteristic of absorbing little of said exposure light;
temporarily storing said mask in a reserve room before carrying said mask into said sealed space;
replacing gas in said reserve room, in which said mask is existing, with said low absorbent gas, and cleaning said mask in said reserve room to remove materials having absorption for exposure light and existing around said mask; and
transporting said mask to a predetermined position in said sealed space and transferring said pattern onto said substrate.

26. An exposure method according to claim 25, wherein said cleaning of mask is performed by irradiating a beam in an ultraviolet range to said mask.

27. An exposure method according to claim 25, wherein said gas-replacement is performed by continuous flow of said specific gas.

28. An exposure method according to claim 25, wherein said mask cleaning is performed by reduction of pressure in said mask-reserve room.

29. An exposure method according to claim 25, wherein said exposure light is light having a wavelength not longer than 200 nm.

30. An exposure method according to claim 25, wherein said specific gas is substantially composed of gases selected from the group consisting of: nitrogen, argon, helium, neon and krypton.

31. A device manufacturing method including a lithographic process, wherein
in said lithographic process, exposure is performed using an exposure method according to claim 25.

32. An exposure method that transfers a pattern of a mask onto a substrate by irradiating said mask with exposure light, the exposure method comprising:
filling a sealed space that covers at least an optical path near said mask of the optical path of said exposure light from said mask to said substrate with gas having a characteristic of absorbing little of said exposure light;
temporarily storing said mask in a reserve room before carrying said mask into said sealed space;
replacing gas in said reserve room, in which said mask is existing, with said low absorbent gas;
removing materials having absorption for exposure light and existing around said mask in said mask-reserve room; and
transporting said mask to a predetermined position in said sealed space and transferring said pattern onto said substrate.

33. An exposure method according to claim 32, further comprising:
replacing gas in a space between said mask and a pellicle disposed in a vicinity of said mask with said low absorbent gas, wherein
said gas replacement of said space between said mask and said pellicle is performed through gas vents on a pellicle-frame disposed in between said mask and said pellicle.

34. An exposure method according to claim 33, wherein said gas replacement of said space between said mask and said pellicle spends time not less than 10 seconds.

35. An exposure method according to claim 32, wherein said mask is transported to said reserve room within a scaled-type mask container having a door that can be opened and closed, and said mask container is opened and closed by an open-close mechanism provided by said reserve room.

36. An exposure method according to claim 35, wherein said mask container is a bottom-open-type mask container on the bottom of which said door is provided.

37. An exposure method according to claim 32, wherein said exposure light is light having a wavelength not longer than 200 nm.

38. An exposure method according to claim 32,
wherein said specific gas is substantially composed of gases selected from the group consisting of: nitrogen, argon, helium, neon and krypton.

39. A device manufacturing method including a lithographic process, wherein
in said lithographic process, exposure is performed using an exposure method according to claim 32.

40. An exposure method according to claim 32, wherein said removal of materials is performed by irradiating a beam in an ultraviolet range to said mask.

41. An exposure method according to claim 32, wherein said removal of materials is made by reduction of pressure in said mask-reserve room.

* * * * *

UNITED STATES PATENT AND TRADEMARK OFFICE
CERTIFICATE OF CORRECTION

PATENT NO. : 6,842,221 B1
DATED : January 11, 2005
INVENTOR(S) : Naomasa Shiraishi It is certified that error appears in the above-identified patent and that said Letters Patent is hereby corrected as shown below:

Title page,
Item [56], References Cited, FOREIGN PATENT DOCUMENTS, add
-- JP 09-197652 07-1997 --.

Signed and Sealed this

Fourteenth Day of June, 2005

JON W. DUDAS
*Director of the United States Patent and Trademark Office*